US010868512B2

(12) United States Patent
Garcia et al.

(10) Patent No.: US 10,868,512 B2
(45) Date of Patent: Dec. 15, 2020

(54) HIGH POWER TRANSVERSELY-EXCITED FILM BULK ACOUSTIC RESONATORS ON Z-CUT LITHIUM NIOBATE

(71) Applicant: Resonant Inc., Goleta, CA (US)

(72) Inventors: Bryant Garcia, Burlingame, CA (US); Robert Hammond, Santa Barbara, CA (US); Patrick Turner, San Bruno, CA (US); Neal Fenzi, Santa Barbara, CA (US); Viktor Plesski, Gorgier (CH); Ventsislav Yantchev, Sofia (BG)

(73) Assignee: Resonant Inc., Goleta, CA (US)

( * ) Notice: Subject to any disclaimer, the term of this patent is extended or adjusted under 35 U.S.C. 154(b) by 0 days.

(21) Appl. No.: 16/829,617

(22) Filed: Mar. 25, 2020

(65) Prior Publication Data
US 2020/0228091 A1 Jul. 16, 2020

Related U.S. Application Data

(63) Continuation of application No. 16/578,811, filed on Sep. 23, 2019, now Pat. No. 10,637,438, which is a
(Continued)

(51) Int. Cl.
*H03H 9/17* (2006.01)
*H03H 9/54* (2006.01)
(Continued)

(52) U.S. Cl.
CPC .............. *H03H 9/171* (2013.01); *H03H 9/02* (2013.01); *H03H 9/54* (2013.01); *H03H 9/02015* (2013.01); *H03H 9/13* (2013.01)

(58) Field of Classification Search
CPC ........ H03H 9/02015; H03H 3/02; H03H 9/13; H03H 9/54; H03H 9/171
(Continued)

(56) References Cited

U.S. PATENT DOCUMENTS 6,540,827 B1 4/2003 Levy et al.
7,463,118 B2 12/2008 Jacobsen
(Continued)

FOREIGN PATENT DOCUMENTS

WO 2016017104 2/2016
WO 2018003273 A1 1/2018

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Benny T Lee
*Assistant Examiner* — Hafizur Rahman
(74) *Attorney, Agent, or Firm* — SoCal IP Law Group LLP; John E. Gunther

(57) ABSTRACT

There is disclosed acoustic resonators and filter devices. An acoustic resonator includes a substrate having a surface and a Z-cut lithium niobate piezoelectric plate having parallel front and back surfaces, the back surface attached to the surface of the substrate except for a portion of the piezoelectric plate forming a diaphragm that spans a cavity in the substrate. An interdigital transducer (IDT) is formed on the front surface of the single-crystal piezoelectric plate such that interleaved fingers of the IDT are disposed on the diaphragm. The IDT is configured to excite a primary acoustic mode in the diaphragm in response to a radio frequency signal applied to the IDT. A thickness of the interleaved fingers of the IDT is greater than or equal to 0.85 times a thickness of the piezoelectric plate.

29 Claims, 21 Drawing Sheets

Related U.S. Application Data continuation-in-part of application No. 16/230,443, filed on Dec. 21, 2018, now Pat. No. 10,491,192.

(60) Provisional application No. 62/685,825, filed on Jun. 15, 2018, provisional application No. 62/701,363, filed on Jul. 20, 2018, provisional application No. 62/741,702, filed on Oct. 5, 2018, provisional application No. 62/748,883, filed on Oct. 22, 2018, provisional application No. 62/753,815, filed on Oct. 31, 2018.

(51) Int. Cl.
*H03H 9/02* (2006.01)
*H03H 9/13* (2006.01)

(58) Field of Classification Search
USPC .......................................................... 333/187
See application file for complete search history.

(56) References Cited

U.S. PATENT DOCUMENTS

| | | | |
|---|---|---|---|
| 7,535,152 | B2 | 5/2009 | Ogami et al. |
| 7,684,109 | B2 | 3/2010 | Godshalk et al. |
| 7,868,519 | B2 | 1/2011 | Umeda |
| 8,278,802 | B1 | 10/2012 | Lee et al. |
| 8,829,766 | B2 | 9/2014 | Milyutin et al. |
| 8,932,686 | B2 | 1/2015 | Hayakawa et al. |
| 9,219,466 | B2 | 12/2015 | Meltaus et al. |
| 9,276,557 | B1 | 3/2016 | Nordquist et al. |
| 9,369,105 | B1 | 6/2016 | Li |
| 9,425,765 | B2 | 8/2016 | Rinaldi |
| 9,525,398 | B1 | 12/2016 | Olsson |
| 9,748,923 | B2 * | 8/2017 | Kando ................. H03H 3/02 |
| 9,780,759 | B2 | 10/2017 | Kimura et al. |
| 2002/0158714 | A1 | 10/2002 | Kaitila et al. |
| 2004/0261250 | A1 | 12/2004 | Kadota et al. |
| 2011/0109196 | A1 | 5/2011 | Goto |
| 2013/0234805 | A1 | 9/2013 | Takahashi |
| 2014/0145556 | A1 | 5/2014 | Kadota |
| 2014/0151151 | A1 | 6/2014 | Reinhardt |
| 2015/0319537 | A1 | 11/2015 | Perois et al. |
| 2015/0333730 | A1 | 11/2015 | Meltaus |
| 2016/0182009 | A1 | 6/2016 | Bhattacharjee |
| 2017/0063332 | A1 | 3/2017 | Gilbert et al. |
| 2017/0179928 | A1 | 6/2017 | Raihn et al. |
| 2017/0214387 | A1 | 7/2017 | Burak et al. |
| 2017/0222622 | A1 | 8/2017 | Solal et al. |
| 2019/0068164 | A1 | 2/2019 | Houlden et al. |
| 2019/0131953 | A1 | 5/2019 | Gong |
| 2019/0273480 | A1 | 9/2019 | Lin |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium-pp. 2110-2113. (Year: 2003).

* cited by examiner

HIGH POWER TRANSVERSELY-EXCITED FILM BULK ACOUSTIC RESONATORS ON Z-CUT LITHIUM NIOBATE

RELATED APPLICATION INFORMATION

This patent is a continuation of application Ser. No. 16/578,811, filed Sep. 23, 2019, entitled TRANSVERSELY-EXCITED FILM BULK ACOUSTIC RESONATORS FOR HIGH POWER APPLICATIONS, now U.S. Pat. No. 10,637,438, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192 B2, which claims priority from the following provisional patent applications: application 62/685,825, filed Jun. 15, 2018, entitled SHEAR-MODE FEAR (XBAR); application 62/701,363, filed Jul. 20, 2018, entitled SHEAR-MODE FEAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEARMODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to bandpass filters with high power capability for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is less than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. The 5G NR standard also defines millimeter wave communication bands with frequencies between 24.25 GHz and 40 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
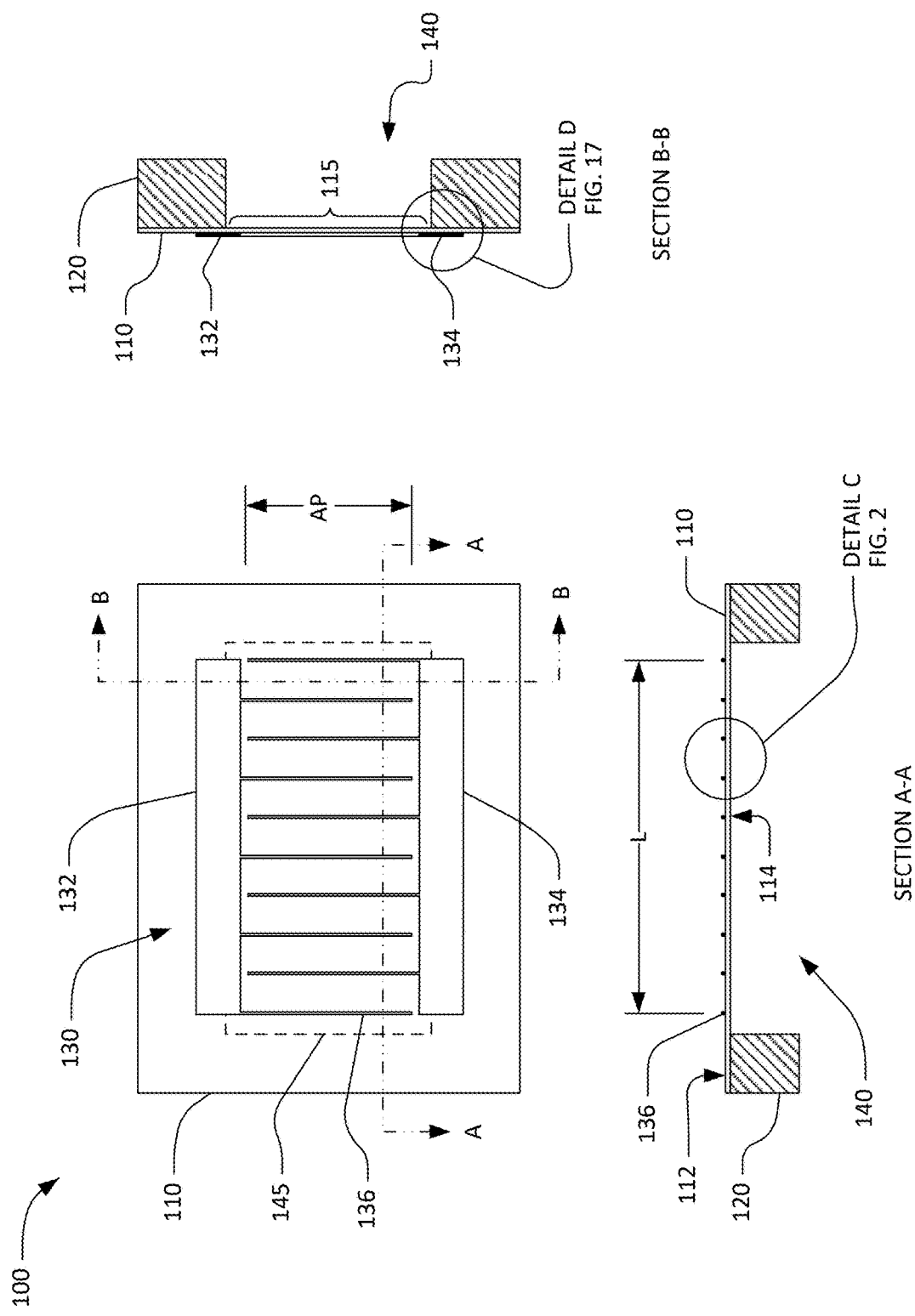
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate are at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
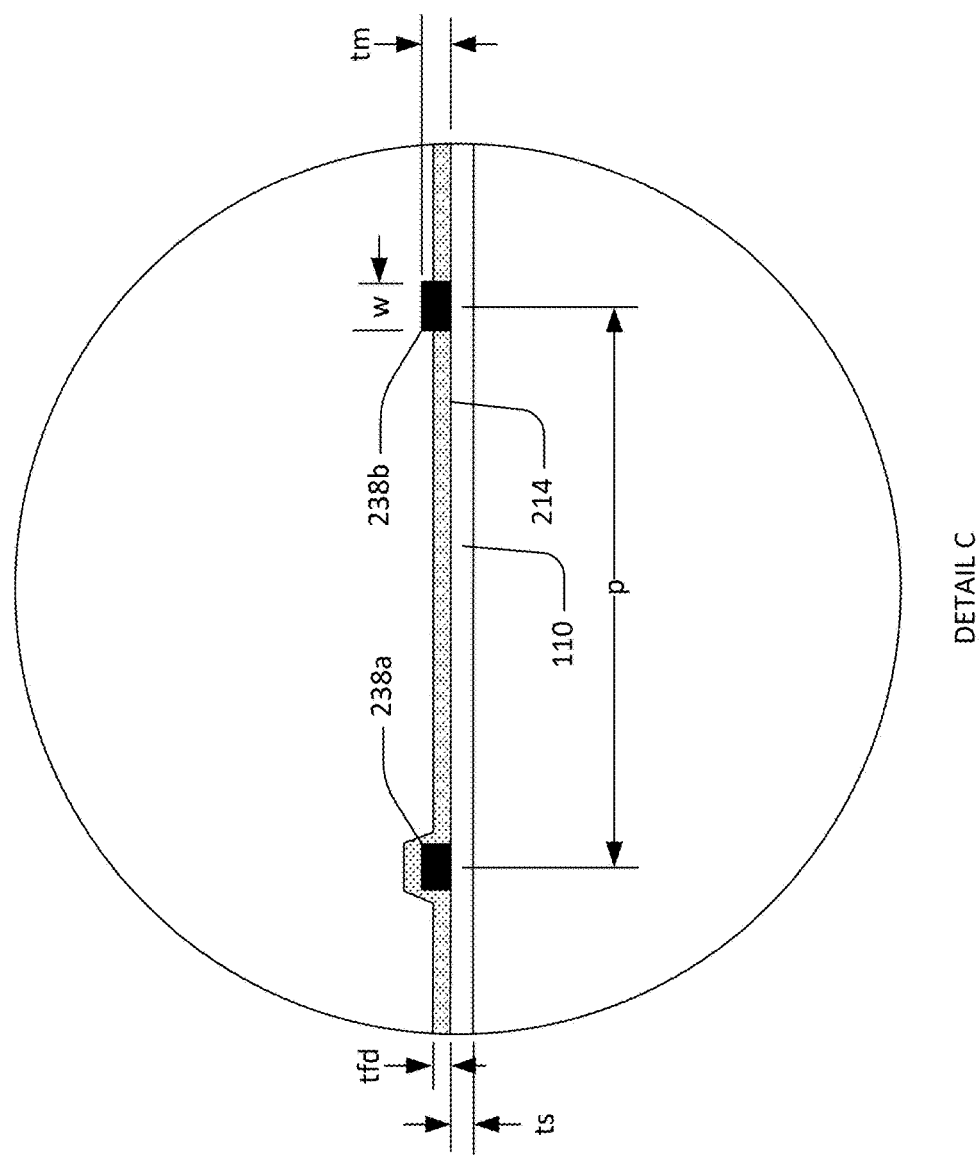
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE' bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 may be formed only between the IDT fingers (e.g. IDT finger 238b) or may be deposited as a blanket layer such that the dielectric layer is formed both between and over the IDT fingers (e.g. IDT finger 238a). The front-side dielectric layer 214 may be a non-piezoelectric dielectric material, such as silicon dioxide or silicon nitride. tfd may be, for example, 0 to 500 nm. tfd is typically less than the thickness ts of the piezoelectric plate. The front-side dielectric layer 214 may be formed of multiple layers of two or more materials.

The IDT fingers 238a and 238b may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
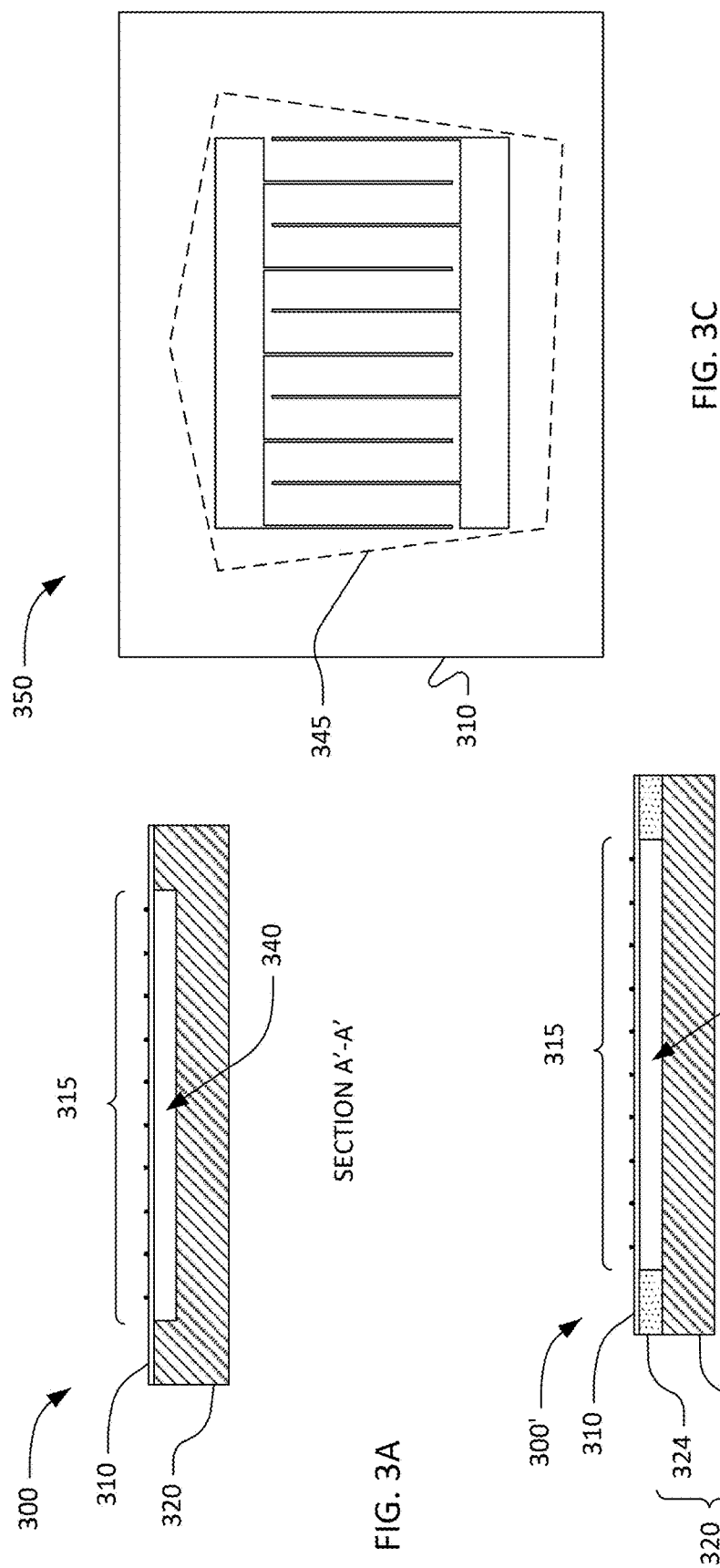
FIG. 3A is an alternative schematic cross-sectional view of the XBAR of FIG. 1.
FIG. 3B is another alternative schematic cross-sectional view of the XBAR of FIG. 1.
FIG. 3C is an alternative schematic plan view of an XBAR

FIG. 3A and FIG. 3B show two alternative cross-sectional views along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may contiguous with the rest of the piezoelectric plate 310 around a large portion of a perimeter 345 of the cavity 340. For example, the diaphragm 315 may contiguous with the rest of the piezoelectric plate 310 around at least 50% of the perimeter 345 of the cavity 340. A intermediate layer (not shown), such as a dielectric bonding layer, may be present between the piezo electric plate 340 and the substrate 320.

In XBAR 300', shown in FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A portion of the piezoelectric plate 310 forms a diaphragm 315 spanning a cavity 340 in the intermediate layer 324. Fingers of an IDT are disposed on the diaphragm 315. The cavity 340 may be formed, for example, by etching the intermediate layer 324 before attaching the piezoelectric plate 310. Alternatively, the cavity 340 may be formed by etching the intermediate layer 324 with a selective etchant that reaches the substrate through one or more openings provided in the piezoelectric plate 310. In this case, the diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter 345 of the cavity 340 as shown in FIG. 3C. Although not shown in FIG. 3B, a cavity formed in the intermediate layer 324 may extend into the base 322.

FIG. 3C is a schematic plan view of another XBAR 350. The XBAR 350 includes an IDT formed on a piezoelectric plate 310. A portion of the piezoelectric plate 310 forms a diaphragm spanning a cavity in a substrate. In this example, the perimeter 345 of the cavity has an irregular polygon shape such that none of the edges of the cavity are parallel, nor are they parallel to the conductors of the IDT. A cavity may have a different shape with straight or curved edges.

Figure 4:
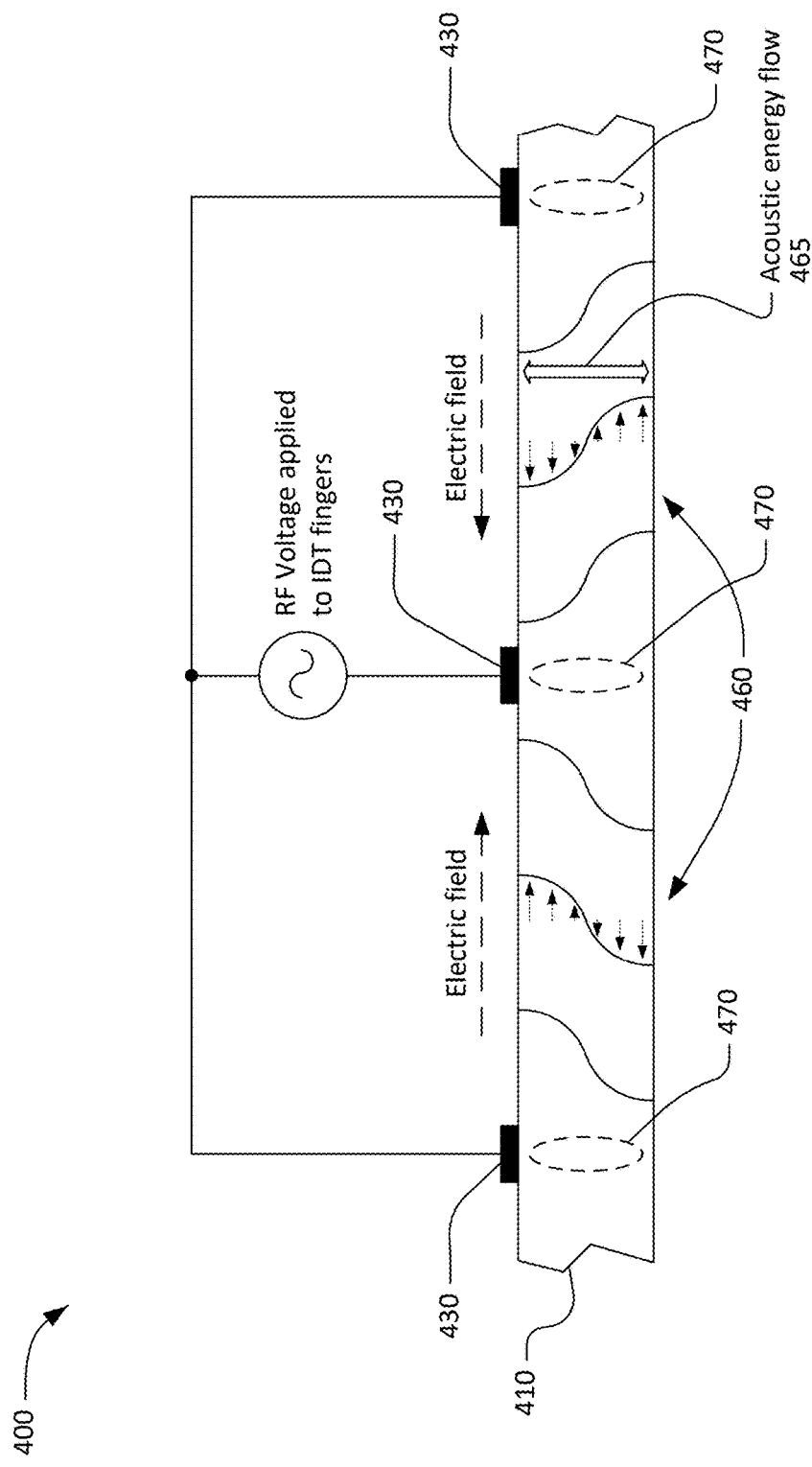
FIG. 4 is a graphic illustrating a primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430 which alternate in electrical polarity from finger to finger. An RF voltage is applied to the interleaved fingers 430. This voltage creates a time-varying electric field between the fingers. The direction of the electric field is predominantly lateral, or parallel to the surface of the piezoelectric plate 410, as indicated by the arrows labeled "electric field". Due to the high dielectric constant of the piezoelectric plate, the RF electric energy is highly concentrated inside the plate relative to the air. The lateral electric field introduces shear deformation which couples strongly to a shear primary acoustic mode (at a resonance frequency defined by the acoustic cavity formed by the volume between the two surfaces of the piezoelectric plate) in the piezoelectric plate 410. In this context, "shear deformation" is defined as deformation in which parallel planes in a material remain predominantly parallel and maintain constant separation while translating (within their respective planes) relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and relative magnitude of atomic motion at the resonance frequency. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary acoustic mode is substantially orthogonal to the surface of the piezoelectric plate, as indicated by the arrow 465.

Considering FIG. 4, there is essentially no RF electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the IDT fingers 430 is low (for example compared to the fingers of an IDT in a SAW resonator) for the primary acoustic mode, which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
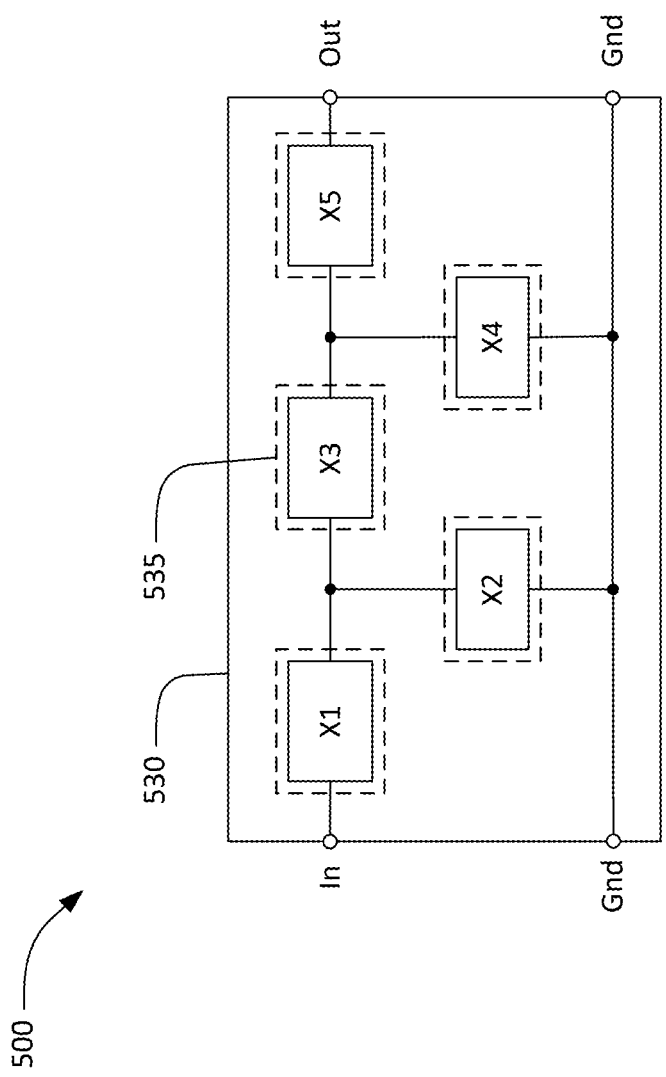
FIG. 5 is a schematic circuit diagram of a band-pass filter using acoustic resonators in a ladder circuit.

FIG. 5 is a schematic circuit diagram of a band-pass filter 500 using five XBARs X1-X5. The filter 500 may be, for example, a band n79 band-pass filter for use in a communication device. The filter 500 has a conventional ladder filter architecture including three series resonators X1, X3, X5 and two shunt resonators X2, X4. The three series resonators X1, X3, X5 are connected in series between a first port and a second port. In FIG. 5, the first and second ports are labeled "In" and "Out", respectively. However, the filter 500 is symmetrical and either port may serve as the input or output of the filter. The two shunt resonators X2, X4 are connected from nodes between the series resonators to ground. All the shunt resonators and series resonators are XBARs.

The three series resonators X1, X3, X5 and the two shunt resonators X2, X4 of the filter 500 maybe formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, an IDT of each resonator is disposed over a respective cavity. In other filters, the IDTs of two or more resonators may be disposed over a common cavity. Resonators may also be cascaded into multiple IDTs which may be formed on multiple cavities.

Each of the resonators X1 to X5 has a resonance frequency and an anti-resonance frequency. In over-simplified terms, each resonator is effectively a short circuit at its resonance frequency and effectively an open circuit at its anti-resonance frequency. Each resonator X1 to X5 creates a "transmission zero", where the transmission between the in and out ports of the filter is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, the anti-resonance frequencies of the series resonators are above the passband, and the resonance frequencies of the shunt resonators are below the passband.

A band-pass filter for use in a communications device, such as a cellular telephone, must meet a variety of requirements. First, a band-pass filter, by definition, must pass, or transmit with acceptable loss, a defined pass-band. Typically, a band-pass filter for use in a communications device must also stop, or substantially attenuate, one or more stop band(s). For example, a band n79 band-pass filter is typically required to pass the n79 frequency band from 4400 MHz to 5000 MHz and to stop the 5 GHz WiFi™ band and/or the n77 band from 3300 MHz to 4200 MHz. To meet these requirements, a filter using a ladder circuit would require series resonators with anti-resonance frequencies about or above 5100 MHz, and shunt resonators with resonance frequencies about or below 4300 MHz.

Figure 6:
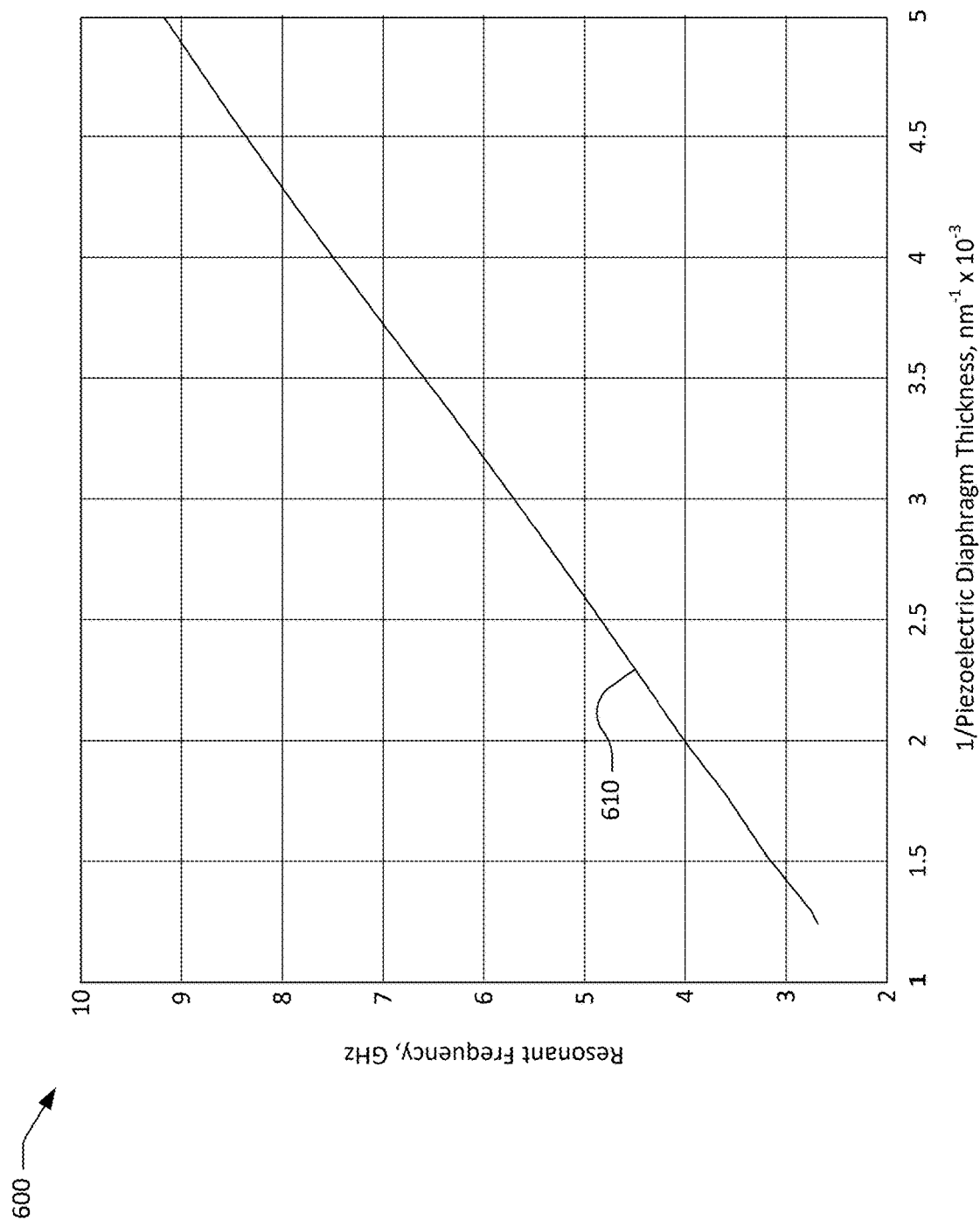
FIG. 6 is a graph showing the relationship between piezoelectric diaphragm thickness and resonance frequency of an XBAR.

The resonance and anti-resonance frequencies of an XBAR are strongly dependent on the thickness ts of the piezoelectric membrane (115 in FIG. 1). FIG. 6 is a graph 600 of resonance frequency of an XBAR versus piezoelectric diaphragm thickness. In this example, the piezoelectric diaphragm is z-cut lithium niobate. The solid curve 610 is plot of resonance frequency as function of the inverse of the piezoelectric plate thickness for XBARs with IDT pitch equal to 3 microns. This plot is based on results of simulations of XBARs using finite element methods. The resonance frequency is roughly proportional to the inverse of the piezoelectric plate thickness.

Figure 7:
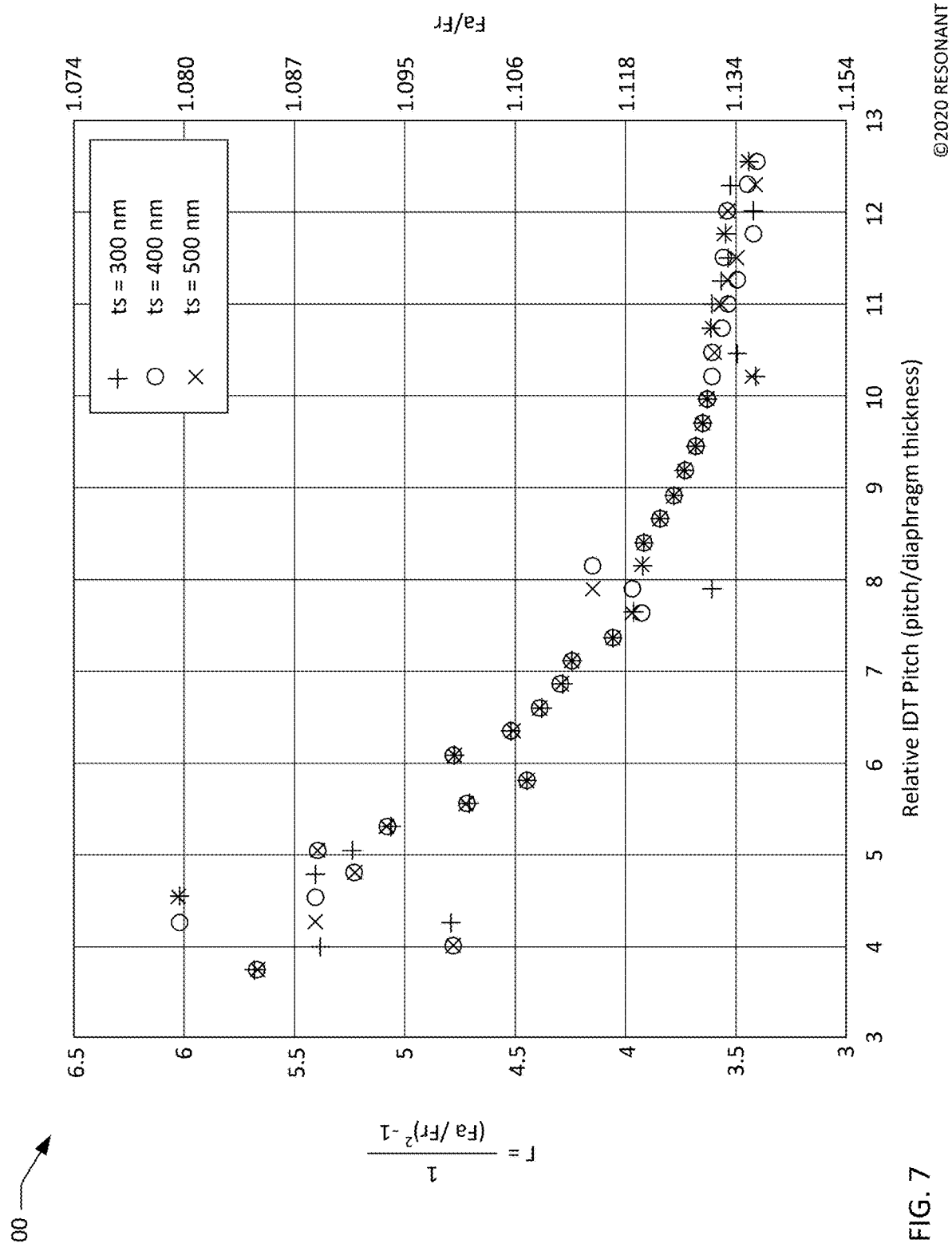
FIG. 7 is a plot showing the relationship between coupling factor Gamma (F) and IDT pitch for an XBAR.

The resonance and anti-resonance frequencies of an XBAR are also dependent on the pitch (dimension p in FIG. 2) of the IDT. Further, the electromechanical coupling of an XBAR, which determines the separation between the resonance and anti-resonance frequencies, is dependent on the pitch. FIG. 7 is a graph of gamma (Γ) as a function of normalized pitch, which is to say IDT pitch p divided by diaphragm thickness ts. Gamma is a metric defined by the equation:

$$\Gamma = \frac{1}{(Fa/Fr)^2 - 1}$$

where Fa is the antiresonance frequency and Fr is the resonance frequency. Large values for gamma correspond to smaller separation between the resonance and anti-resonance frequencies. Low values of gamma indicate strong coupling which is good for wideband ladder filters.

In this example, the piezoelectric diaphragm is z-cut lithium niobate, and data is presented for diaphragm thicknesses of 300 nm, 400 nm, and 500 nm. In all cases the IDT is aluminum with a thickness of 25% of the diaphragm thickness, the duty factor (i.e. the ratio of the width w to the pitch p) of the IDT fingers is 0.14, and there are no dielectric layers. The "+" symbols, circles, and "x" symbols represent diaphragm thicknesses of 300 nm, 400 nm, and 500 nm, respectively. Outlier data points, such as those for relative IDT pitch about 4.5 and about 8, are caused by spurious modes interacting with the primary acoustic mode and altering the apparent gamma. The relationship between gamma and IDT pitch is relatively independent of diaphragm thickness, and roughly asymptotic to Γ=3.5 as the relative pitch is increased.

Another typical requirement on a band-pass filter for use in a communications device is the input and output impedances of the filter have to match, at least over the pass-band of the filter, the impedances of other elements of the communications device to which the filter is connected (e.g. a transmitter, receiver, and/or antenna) for maximum power transfer. Commonly, the input and output impedances of a band-pass filter are required to match a 50-ohm impedance within a tolerance that may be expressed, for example, as a maximum return loss or a maximum voltage standing wave ratio. When necessary, an impedance matching network comprising one or more reactive components can be used at the input and/or output of a band-pass filter. Such impedance matching networks add to the complexity, cost, and insertion loss of the filter and are thus undesirable. To match, without additional impedance matching components, a 50-Ohm impedance at a frequency of 5 GHz, the capacitances of at least the shunt resonators in the band-pass filter need to be in a range of about 0.5 picofarads (pF) to about 1.5 picofarads.

Figure 8:
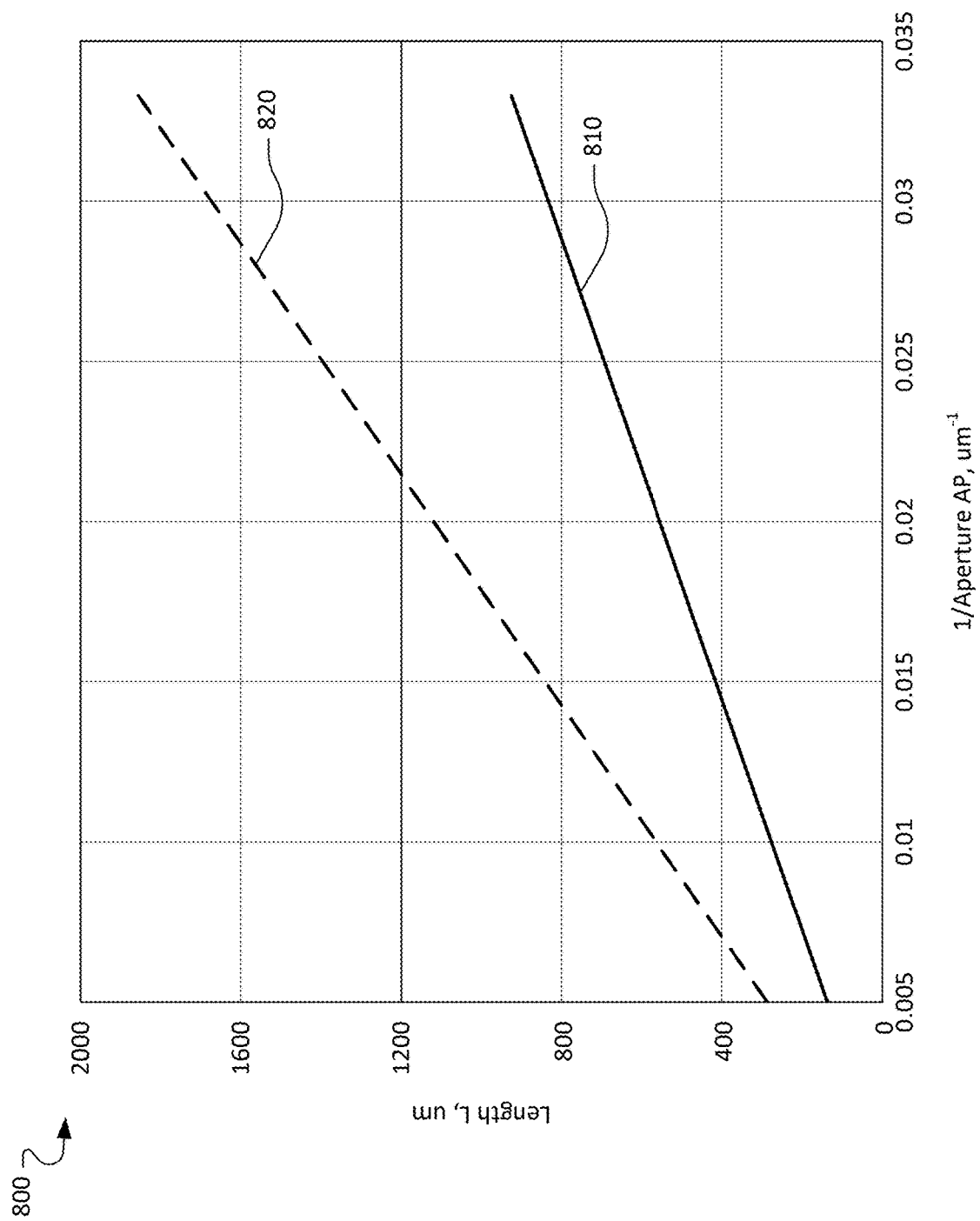
FIG. 8 is a graph showing the dimensions of XBAR resonators with capacitance equal to one picofarad.

FIG. 8 is a graph 800 showing the area and dimensions of XBAR resonators with capacitance equal to one picofarad (pF). The solid line 810 is a plot of the IDT length required provide a capacitance of 1 pF as a function of the inverse of the IDT aperture when the IDT pitch is 3 microns. The dashed line 820 is a plot of the IDT length required provide a capacitance of I pF as a function of the inverse of the IDT aperture when the IDT pitch is 5 microns. The data plotted in FIG. 8 is specific to XBAR devices with lithium niobate diaphragm thickness of 400 nm.

For any aperture, the IDT length required to provide a desired capacitance is greater for an IDT pitch of 5 microns than for an IDT pitch of 3 microns. The required IDT length is roughly proportional to the change in IDT pitch. The design of a filter using XBARs is a compromise between somewhat conflicting objectives. As shown in FIG. 7, a larger IDT pitch may be preferred to reduce gamma and maximize the separation between the anti-resonance and resonance frequencies. As can be understood from FIG. 8, smaller IDT pitch is preferred to minimize IDT area. A reasonable compromise between these objectives is 6≤p/ts≤12.5. Setting the IDT pitch p equal to or greater than six times the diaphragm thickness ts provides Fa/Fr greater than 1.1. Setting the maximum IDT pitch p to 12.5 times the diaphragm thickness ts is reasonable since Fa/Fr does not increase appreciably for higher values of relative pitch.

As will be discussed is greater detail subsequently, the metal fingers of the IDTs provide the primary mechanism for removing heat from an XBAR resonator. Increasing the aperture of a resonator increases the length and the electrical and thermal resistance of each IDT finger. Further, for a given IDT capacitance, increasing the aperture reduces the number of fingers required in the IDT, which, in turn, proportionally increases the RF current flowing in each finger. All of these effects argue for using the smallest possible aperture in resonators for high-power filters.

Conversely, several factors argue for using a large aperture. First, the total area of an XBAR resonator includes the area of the IDT and the area of the bus bars. The area of the bus bars is generally proportional to the length of the IDT. For very small apertures, the area of the IDT bus bars may be larger than the area occupied by the interleaved IDT fingers. Further, some electrical and acoustic energy may be lost at the ends of the IDT fingers. These loss effects become more significant as IDT aperture is reduced and the total number of fingers is increased. These losses may be evident as a reduction in resonator Q-factor, particularly at the anti-resonance frequency, as IDT aperture is reduced.

As a compromise between conflicting objectives, resonators apertures will typically fall in the range from 20 μm and 60 μm.

Figure 9:
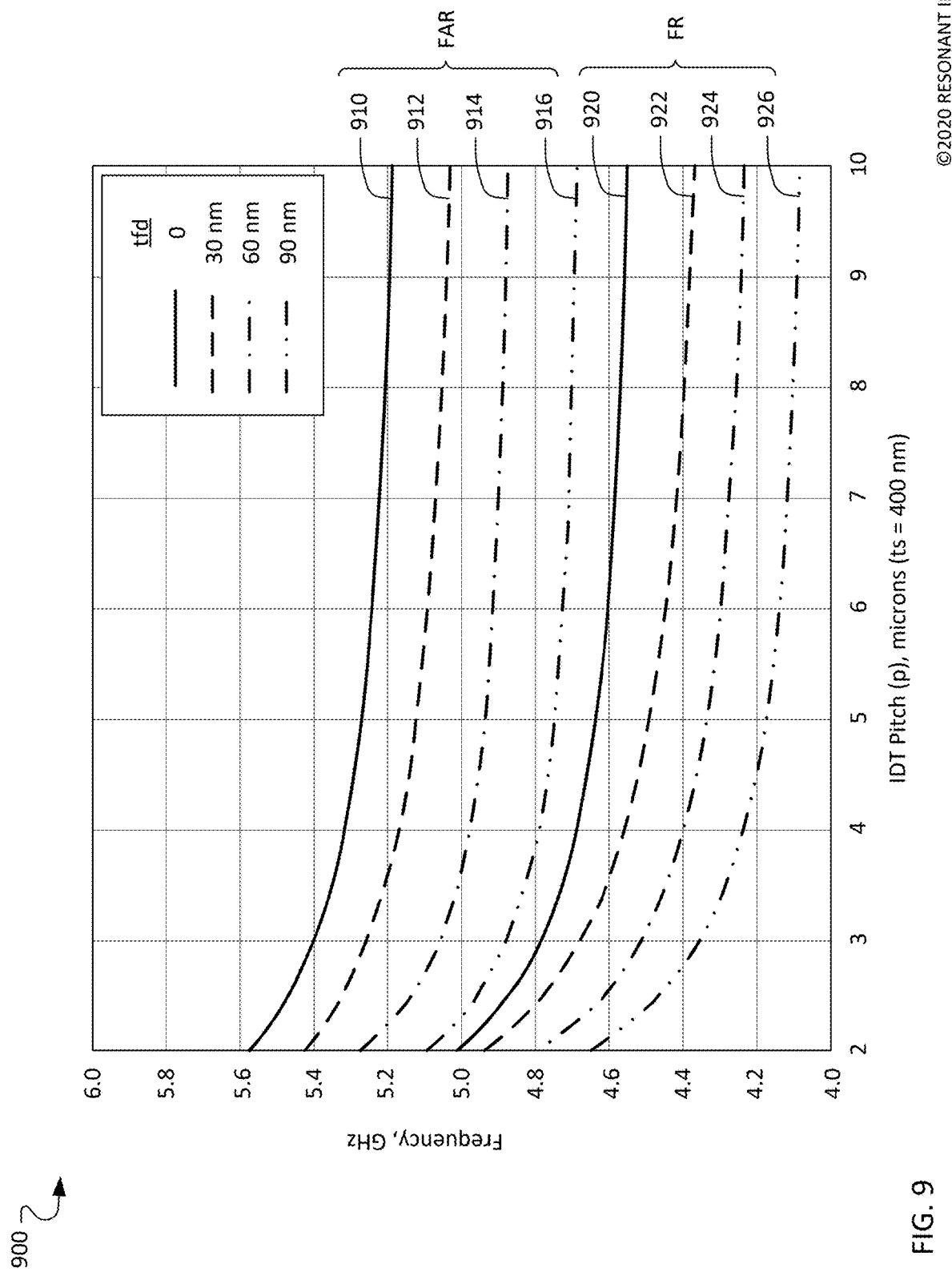
FIG. 9 is a graph showing the relationship between IDT finger pitch and resonance and anti-resonance frequencies of an XBAR, with dielectric layer thickness as a parameter.

The resonance and anti-resonance frequencies of an XBAR are also dependent on the thickness (dimension tfd in FIG. 2) of the front-side dielectric layer applied between (and optionally over) the fingers of the IDT. FIG. 9 is a graph 900 of anti-resonant frequency and resonant frequency as a function of IDT finger pitch p for XBAR resonators with z-cut lithium niobate piezoelectric plate thickness is =400 nm, with front-side dielectric layer thickness tfd as a parameter. The solid lines 910 and 920 are plots of the anti-resonance and resonance frequencies, respectively, as functions of IDT pitch for tfd=0. The dashed lines 912 and 922 are plots of the anti-resonance and resonance frequencies, respectively, as functions of IDT pitch for tfd=30 nm. The dash-dot lines 914 and 924 are plots of the anti-resonance and resonance frequencies, respectively, as functions of IDT pitch for tfd=60 nm. The dash-dot-dot lines 916 and 926 are plots of the anti-resonance and resonance frequencies, respectively, as functions of IDT pitch for tfd=90 nm. The frequency shifts are approximately linear functions of tfd.

In FIG. 9, the difference between the resonance and anti-resonance frequencies is 600 to 650 MHz for any particular values for front-side dielectric layer thickness and IDT pitch. This difference is large compared to that of older acoustic filter technologies, such as surface acoustic wave filters. However, 650 MHz is not sufficient for very wide band filters such as band-pass filters needed for bands n77 and n79. As described in application Ser. No. 16/230,443, the front-side dielectric layer over shunt resonators may be thicker than the front-side dielectric layer over series resonators to increase the frequency difference between the resonant frequencies of the shunt resonators and the anti-resonance frequencies of the series resonators.

Communications devices operating in time-domain duplex (TDD) bands transmit and receive in the same frequency band. Both the transmit and receive signal paths pass through a common bandpass filter connected between an antenna and a transceiver. Communications devices operating in frequency-domain duplex (FDD) bands transmit and receive in different frequency bands. The transmit and receive signal paths pass through separate transmit and receive bandpass filters connected between an antenna and the transceiver. Filters for use in TDD bands or filters for use as transmit filters in FDD bands can be subjected to radio frequency input power levels of 30 dBm or greater and must avoid damage under power.

The insertions loss of acoustic wave bandpass filters is usually not more than a few dB. Some portion of this lost power is return loss reflected back to the power source; the rest of the lost power is dissipated in the filter. Typical band-pass filters for LTE bands have surface areas of 1.0 to 2.0 square millimeters. Although the total power dissipation in a filter may be small, the power density can be high given the small surface area. Further, the primary loss mechanisms in an acoustic filter are resistive losses in the conductor patterns and acoustic losses in the IDT fingers and piezoelectric material. Thus the power dissipation in an acoustic filter is concentrated in the acoustic resonators. To prevent excessive temperature increase in the acoustic resonators, the heat due to the power dissipation must be conducted away from the resonators through the filter package to the environment external to the filter.

In traditional acoustic filters, such as surface acoustic wave (SAW) filters and bulk acoustic wave (BAW) filters, the heat generated by power dissipation in the acoustic resonators is efficiently conducted through the filter substrate and the metal electrode patterns to the package. In an XBAR device, the resonators are disposed on thin piezoelectric membranes that are inefficient heat conductors. The large majority of the heat generated in an XBAR device must be removed from the resonator via the IDT fingers and associated conductor patterns.

To minimize power dissipation and maximize heat removal, the IDT fingers and associated conductors should be formed from a material that has low electrical resistivity and high thermal conductivity. Metals having both low resistivity and high thermal conductivity are listed in the following table:

| Metal | Electrical resistivity ($10^{-6}$ Ω-cm) | Thermal conductivity (W/m-K) |
| --- | --- | --- |
| Silver | 1.55 | 419 |
| Copper | 1.70 | 385 |
| Gold | 2.2 | 301 |
| Aluminum | 2.7 | 210 |

Silver offers the lowest resistivity and highest thermal conductivity but is not a viable candidate for IDT conductors due to the lack of processes for deposition and patterning of silver thin films. Appropriate processes are available for copper, gold, and aluminum. Aluminum offers the most mature processes for use in acoustic resonator devices and potentially the lowest cost, but with higher resistivity and reduced thermal conductivity compared to copper and gold. For comparison, the thermal conductivity of lithium niobate is about 4 W/m-K, or about 2% of the thermal conductivity of aluminum. Aluminum also has good acoustic attenuation properties which helps minimize dissipation.

The electric resistance of the IDT fingers can be reduced, and the thermal conductivity of the IDT fingers can be increased, by increasing the cross-sectional area of the fingers to the extent possible. As described in conjunction with FIG. 4, unlike SAW or AlN BAW, for XBAR there is little coupling of the primary acoustic mode to the IDT fingers. Changing the width and/or thickness of the IDT fingers has minimal effect on the primary acoustic mode in an XBAR device. This is a very uncommon situation for an acoustic wave resonator. However, the IDT finger geometry does have a substantial effect on coupling to spurious acoustic modes, such as higher order shear modes and plate modes that travel laterally in the piezoelectric diaphragm.

Figure 10:
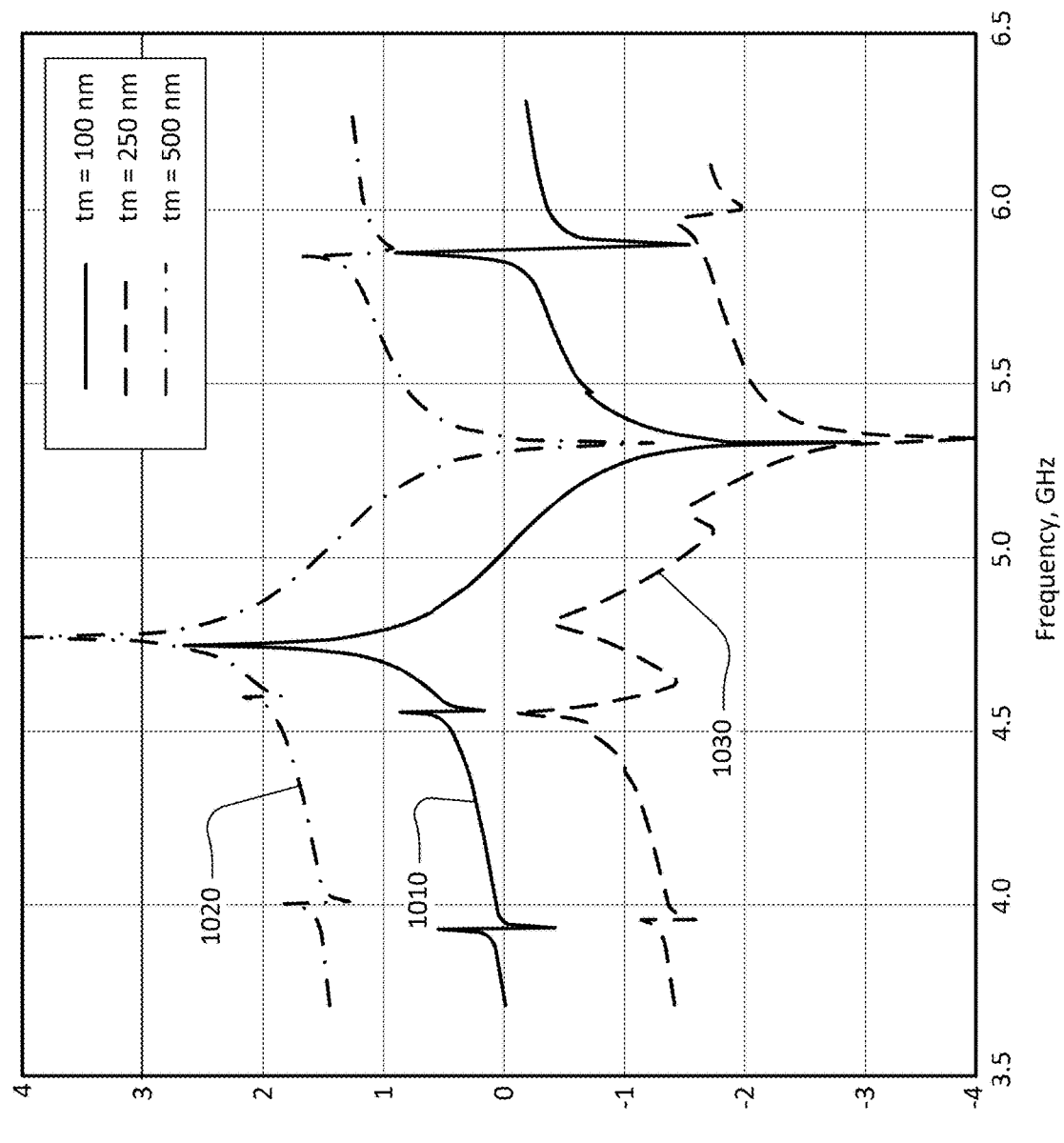
FIG. 10 is a graph comparing the admittances of three simulated XBARs with different IDT metal thicknesses.

FIG. 10 is a chart 1000 illustrating the effect that IDT finger thickness can have on XBAR performance. The solid curve 1010 is a plot of the magnitude of the admittance of an XBAR device with the thickness of the IDT fingers tm=100 nm. The dashed curve 1030 is a plot of the magnitude of the admittance of an XBAR device with the thickness of the IDT fingers tm=250 nm. The dot-dash curve 1020 is a plot of the magnitude of the admittance of an XBAR device with the thickness of the IDT fingers tm =500 nm. The three curves 1010, 1020, 1030 have been offset vertically by about 1.5 units for visibility. The three XBAR devices are identical except for the thickness of the IDT fingers. The piezoelectric plate is lithium niobate 400 nm thick, the IDT electrodes are aluminum, and the IDT pitch is 4 microns. The XBAR devices with tm=100 nm and tm=500 nm have similar resonance frequencies, Q-factors, and electromechanical coupling. The XBAR device with tm=250 nm exhibits a spurious mode at a frequency near the resonance frequency, such that the resonance is effectively split into two low Q-factor, low admittance peaks separated by several hundred MHz. The XBAR with tm =250 nm (curve 1030) may not be useable in a filter.

Figure 11:
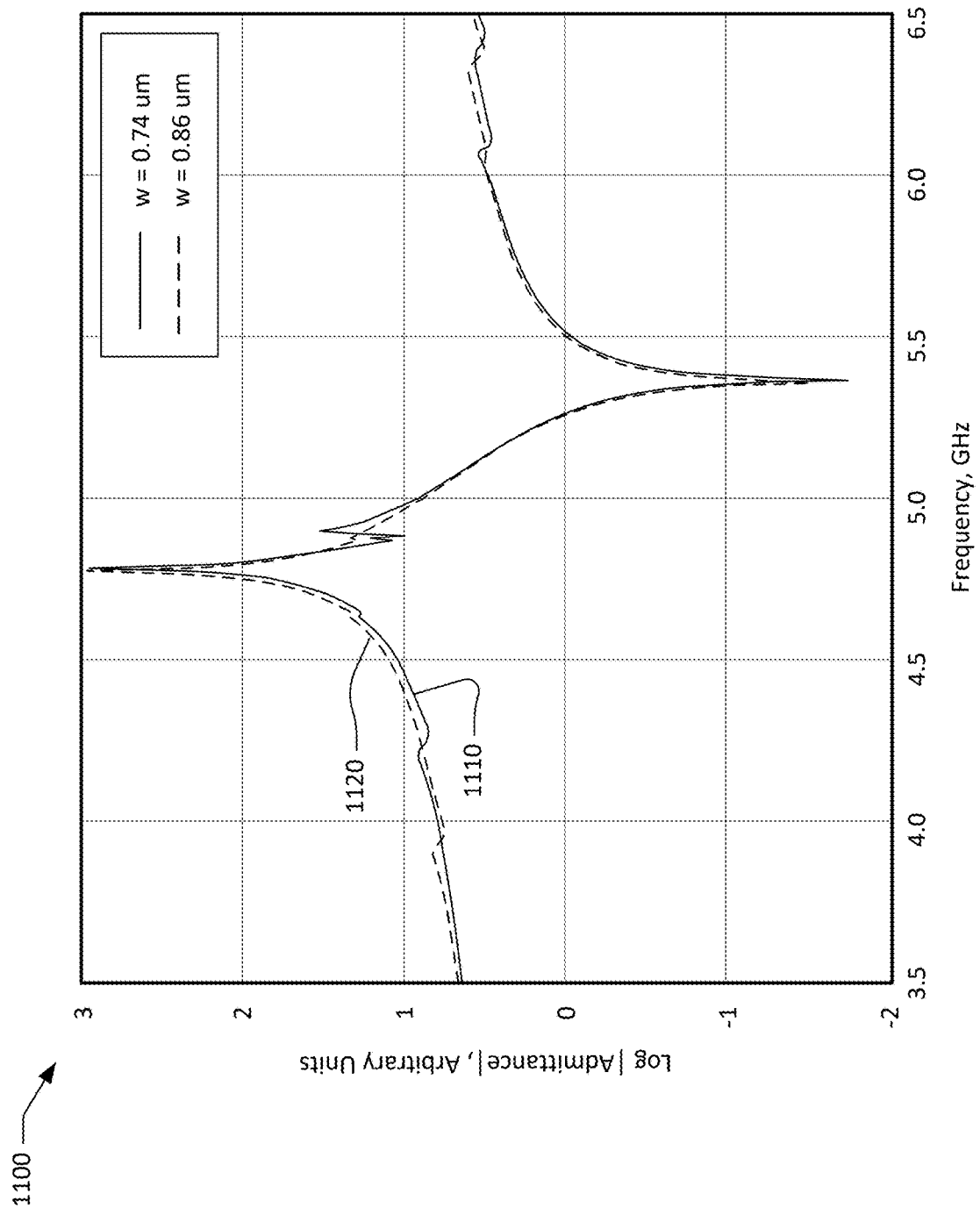
FIG. 11 is a graph illustrating the effect of IDT finger width on spurious resonances in an XBAR.

FIG. 11 is a chart 1100 illustrating the effect that IDT finger width w can have on XBAR performance. The solid curve 1110 is a plot of the magnitude of the admittance of an XBAR device with the width of the IDT fingers w=0.74 micron. Note the spurious mode resonance at a frequency about 4.9 GHz, which could lie within the pass-band of a filter incorporating this resonator. Such effects could cause an unacceptable perturbation in the transmittance within the filter passband. The dashed curve 1120 is a plot of the magnitude of the admittance of an XBAR device with the width of the IDT fingers w=0.86 micron. The two resonators are identical except for the dimension w. The piezoelectric plate is lithium niobate 400 nm thick, the IDT electrodes are aluminum, and the IDT pitch is 3.25 microns. Changing w from 0.74 micron to 0.86 micron suppressed the spurious mode with little or no effect on resonance frequency and electromechanical coupling.

Given the complex dependence of spurious mode frequency and amplitude on diaphragm thickness ts, IDT metal thickness tm, IDT pitch p and IDT finger width w, the inventors undertook an empirical evaluation, using two-dimensional finite element modeling, of a large number of hypothetical XBAR resonators. For each combination of diaphragm thickness ts, IDT finger thickness tm, and IDT pitch p, the XBAR resonator was simulated for a sequence of IDT finger width w values. A figure of merit (FOM) was calculated for each value of finger width w to estimate the negative impact of spurious modes. The FOM is calculated by integrating the negative impact of spurious modes across a defined frequency range. The FOM and the frequency range depend on the requirements of a particular filter. The frequency range typically includes the passband of the filter and may include one or more stop bands. Spurious modes occurring between the resonance and anti-resonance frequencies of each hypothetical resonator were given a heavier weight in the FOM than spurious modes at frequencies below resonance or above anti-resonance. Hypothetical resonators having a minimized FOM below a threshold value were considered potentially "useable", which is to say probably having sufficiently low spurious modes for use in a filter. Hypothetical resonators having a minimized cost function above the threshold value were considered not useable.

Figure 12:
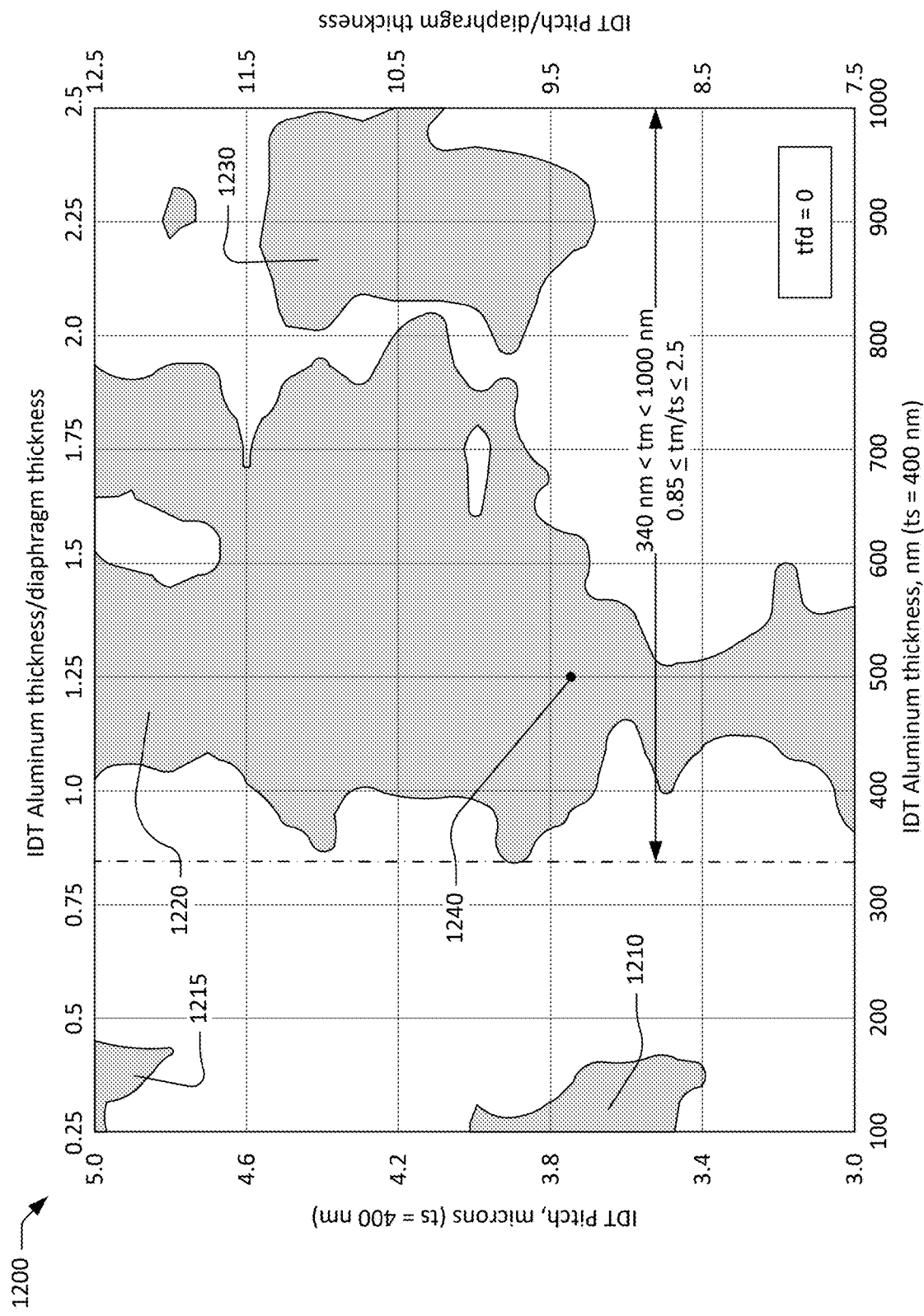
FIG. 12 is a graph identifying preferred combinations of aluminum IDT thickness and IDT pitch for XBARs without a front dielectric layer.

FIG. 12 is a chart 1200 showing combinations of IDT pitch and IDT finger thickness that may provide useable resonators. This chart is based on two-dimensional simulations of XBARs with lithium niobate diaphragm thickness ts=400 nm, aluminum conductors, and front-side dielectric thickness tfd=0. XBARs with IDT pitch and thickness within shaded regions 1210, 1215, 1220, 1230 are likely to have sufficiently low spurious effects for use in filters. For each combination of IDT pitch and IDT finger thickness, the width of the IDT fingers was selected to minimize the FOM. The black dot 1240 represents an XBAR used in a filter to be discussed subsequently. Usable resonators exist for IDT finger thickness greater than or equal to 340 nm and less than or equal to 1000 nm.

As previously discussed, wide bandwidth filters using XBARs may use a thicker front-side dielectric layer on shunt resonators than on series resonators to lower the resonance frequencies of the shunt resonators with respect to the resonance frequencies of the series resonators. The front-side dielectric layer on shunt resonators may be as much as 150 nm thicker than the front side dielectric on series resonators. For ease of manufacturing, it may be preferable that the same IDT finger thickness be used on both shunt and series resonators.

Figure 13:
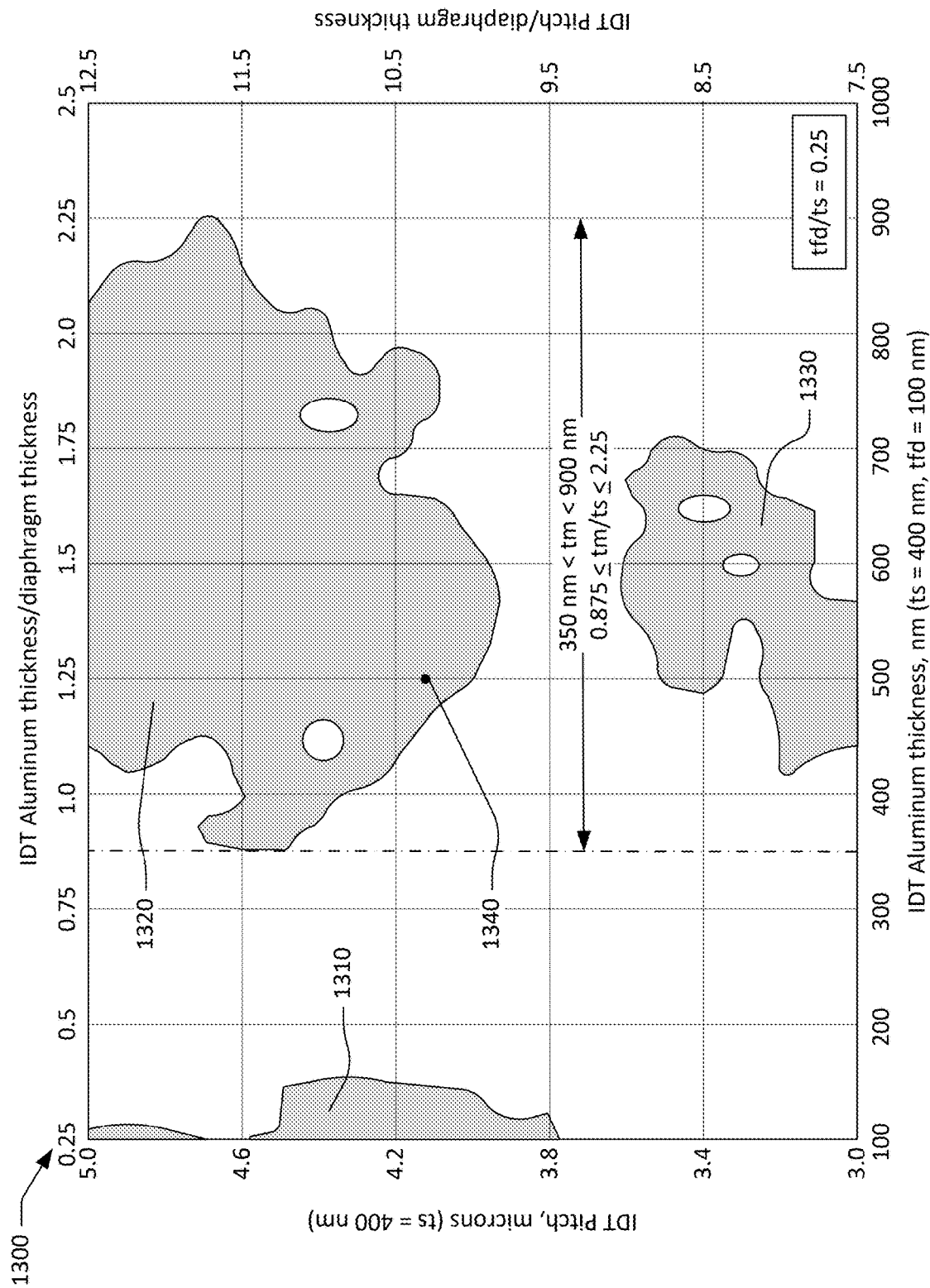
FIG. 13 is a graph identifying preferred combinations of aluminum IDT thickness and IDT pitch for XBARs with front dielectric layer thickness equal to 0.25 times the XBAR diaphragm thickness.

FIG. 13 is another chart 1300 showing combinations of IDT pitch and IDT finger thickness that may provide useable resonators. This chart is based on simulations of XBARs with lithium niobate diaphragm thickness=400 nm, aluminum conductors, and tfd=100 nm. XBARs having IDT pitch and thickness within shaded regions 1310, 1320, 1330 are likely to have sufficiently low spurious effects for use in filters. For each combination of IDT pitch and IDT finger thickness, the width of the IDT fingers was selected to minimize the FOM. The black dot 1340 represents an XBAR used in a filter to be discussed subsequently. Usable resonators exist for IDT finger thickness greater than or equal to 350 nm and less than or equal to 900 nm.

Assuming that a filter is designed with no front-side dielectric layer on series resonators and 100 nm of front-side dielectric on shunt resonators, FIG. 12 and FIG. 13 jointly define the combinations of metal thickness and IDT pitch that result in useable resonators. Specifically, FIG. 12 defines useable combinations of metal thickness and IDT pitch for series resonators and FIG. 13 defines useable combinations of metal thickness and IDT for shunt resonators. Since only a single metal thickness is desirable for ease of manufacturing, the overlap between the ranges defined in FIG. 12 and FIG. 13 defines the range of metal thicknesses for filter using a front-side dielectric to shift the resonance frequency of shunt resonator. Comparing FIG. 12 and FIG. 13, IDT aluminum thickness between 350 nm and 900 nm (350 nm≤tm≤900 nm) provides at least one useable value of pitch for both series and shunt resonators.

Figure 14:
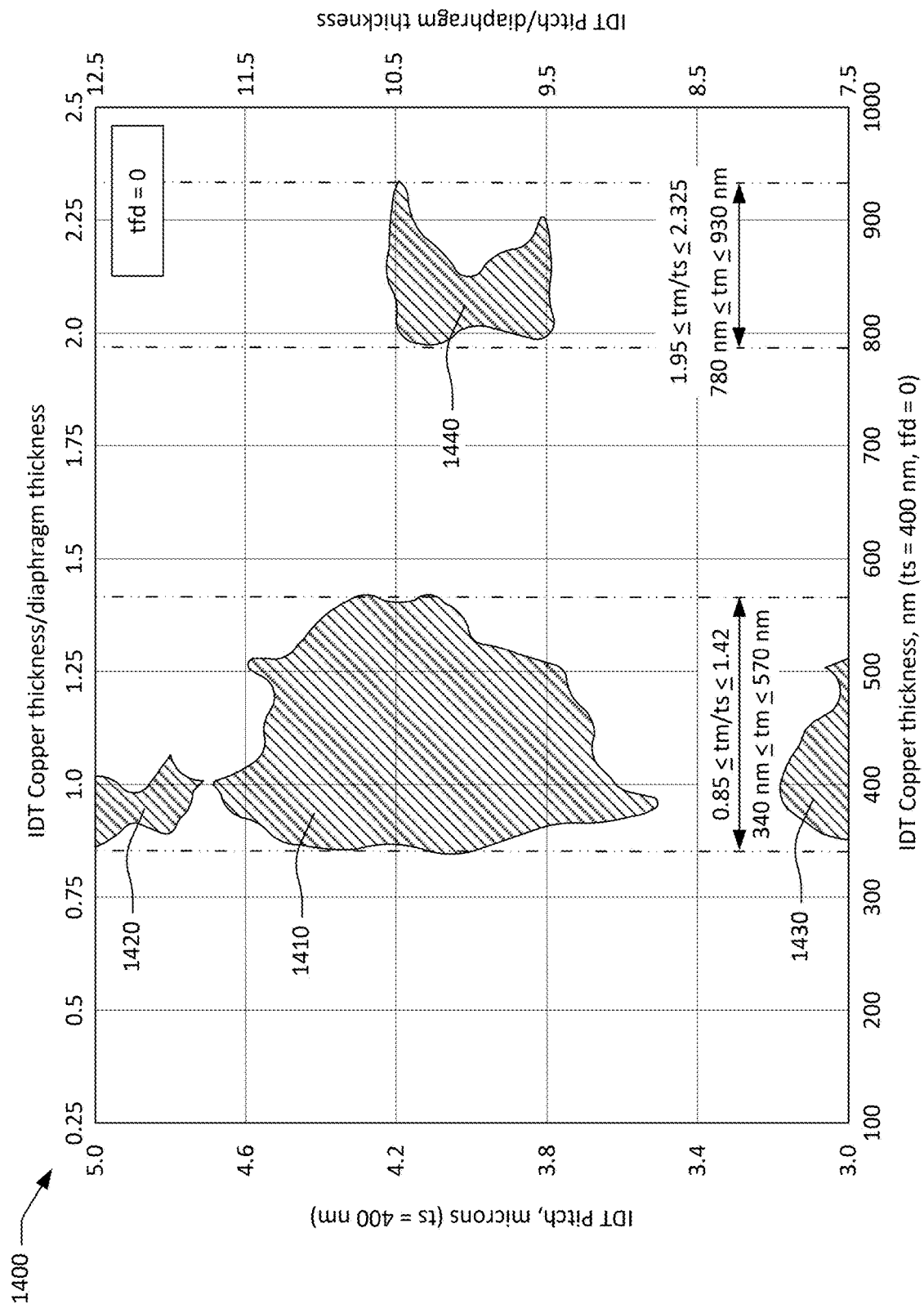
FIG. 14 is a graph identifying preferred combinations of copper IDT thickness and IDT pitch for XBARs without a front dielectric layer.

FIG. 14 is another chart 1400 showing combinations of IDT pitch and IDT finger thickness that may provide useable resonators. The chart is comparable to FIG. 12 with copper, rather than aluminum, conductors. FIG. 14 is based on simulations of XBARs with lithium niobate diaphragm thickness=400 nm, copper conductors, and tfd=0. XBARs having IDT pitch and finger width within shaded regions 1410, 1420, 1430, 1440 are likely to have sufficiently low spurious effects for use in filters. For each combination of IDT pitch and IDT finger thickness, the width of the IDT fingers is selected to minimize the FOM. Usable resonators exist for IDT finger thickness greater than or equal to 340 nm and less than or equal to 570 nm, and for IDT finger thickness greater than or equal to 780 nm and less than or equal to 930 nm.

Figure 15:
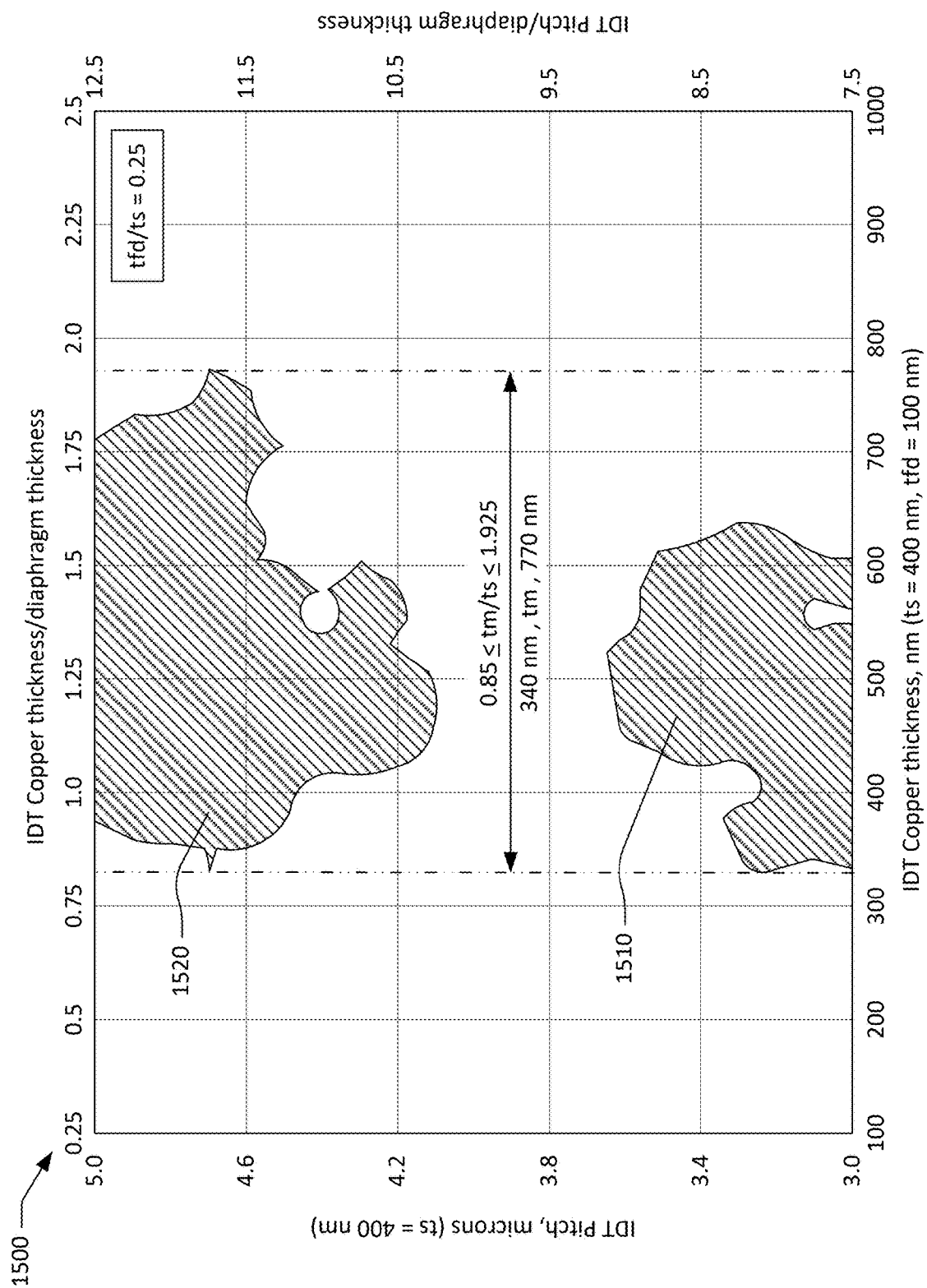
FIG. 15 is a graph identifying preferred combinations of copper IDT thickness and IDT pitch for XBARs with front dielectric layer thickness equal to 0.25 times the XBAR diaphragm thickness.

FIG. 15 is another chart 1500 showing combinations of IDT pitch and IDT finger thickness that may provide usable resonators. This chart is based on simulations of XBARs with lithium niobate diaphragm thickness=400 nm, copper conductors, and tfd=100 nm. XBARs having IDT pitch and finger thickness within shaded regions 1510, 1520 are likely to have sufficiently low spurious effects for use in filters. For each combination of IDT pitch and IDT finger thickness, the width of the IDT fingers is selected to minimize the cost function. IDT finger thickness greater than or equal to 340 nm and less than or equal to 770 nm.

Assuming that a filter is designed with no front-side dielectric layer on series resonators and 100 nm of front-side dielectric on shunt resonators, FIG. 14 and FIG. 15 jointly define the combinations of metal thickness and IDT pitch that result in useable resonators. Specifically, FIG. 14 defines useful combinations of metal thickness and IDT pitch for series resonators and FIG. 15 defines useful combinations of metal thickness and IDT pitch for shunt resonators. Since only a single metal thickness is desirable for ease of manufacturing, the overlap between the ranges defined in FIG. 14 and FIG. 15 defines the range of metal thicknesses for filter using a front-side dielectric to shift the resonance frequency of shunt resonator. Comparing FIG. 14 and FIG. 15, IDT copper thickness between 340 nm and 570 nm provides at least one useable value of pitch for series and shunt resonators.

Charts similar to FIG. 12, FIG. 13, FIG. 14, and FIG. 15, can be prepared for other values of front-side dielectric thickness, and other conductor materials such as Gold.

Figure 16:
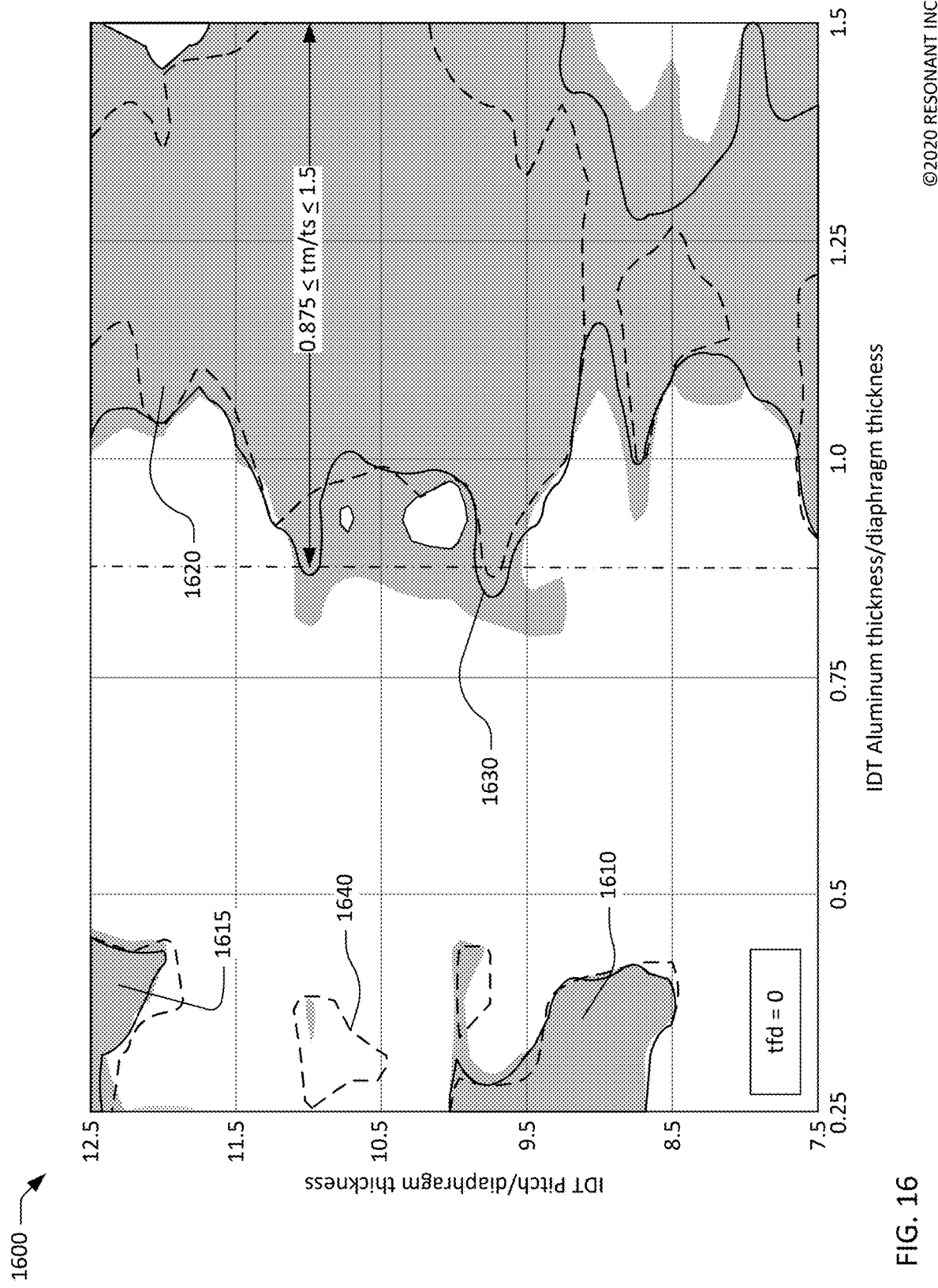
FIG. 16 is a graph identifying preferred combinations of aluminum IDT thickness and IDT pitch for XBARs without a front dielectric layer for diaphragm thicknesses of 300 nm, 400 nm, and 500 nm.

FIG. 16 is a chart 1600 showing combinations of IDT pitch and IDT finger thickness that may provide useable resonators on different thickness diaphragms. The shaded regions 1610, 1615, 1620 define useable combinations of IDT pitch and aluminum IDT thickness for a diaphragm thickness of 500 nm. The areas enclosed by solid lines, such as line 1630, define useable combinations of IDT pitch and aluminum IDT thickness for a diaphragm thickness of 400 nm. The solid lines are the boundaries of the shaded areas 1210, 1215, and 1220 of FIG. 12. The areas enclosed by dashed lines, such as line 1640, define useable combinations of IDT pitch and aluminum IDT thickness for a diaphragm thickness of 300 nm.

Although the combinations of IDT thickness and pitch that result in useable resonators on 500 nm diaphragms (shaded regions 1610, 1615, 1620), 400 nm diaphragms (regions enclosed by solid lines), and 300 nm diaphragms (regions enclosed by dashed lines) are not identical, the same general trends are evident. For diaphragm thicknesses of 300, 400, and 500 nm, useable resonators may be made with IDT metal thickness less than about 0.375 times the diaphragm thickness. Further, for diaphragm thicknesses of 300, 400, and 500 nm, useable resonators may be made with IDT aluminum thickness greater than about 0.85 times the diaphragm thickness and up to at least 1.5 times the diaphragm thickness. Although not shown in FIG. 16, it is believed that the conclusions drawn from FIG. 12 to FIG. 15 can be scaled with diaphragm thickness. For aluminum IDT conductors, the range of IDT thickness that will provide useful resonators is given by the formula $0.85 \le tm/ts \le 2.5$. For filters using a front-side dielectric to shift the resonance frequency of shunt resonators, the range of aluminum IDT thickness that will provide useful resonators is given by the formula $0.875 \le tm/ts \le 2.25$. For copper IDT conductors, the range of IDT thickness that will provide useful resonators is given by the formula $0.85 \le tm/ts \le 1.42$ or the formula $1.95 \le tm/ts \le 2.325$. For filters using a front-side dielectric to shift the resonance frequency of shunt resonators, the range of aluminum IDT thickness that will provide useful resonators is given by the formula $0.85 \le tm/ts \le 1.42$.

Experimental results indicate that thin IDT fingers (i.e. $tm/ts \le 0.375$) cannot adequately transport heat out of the resonator area and IDTs with such thin IDT fingers are unsuitable for high power applications. Thick IDT conductors (i.e. $tm/ts \ge 0.85$) provide greatly improved heat transport. Experimental results indicate that filters using XBAR resonators with 500 nm aluminum IDT fingers and 400 nm diaphragm thickness (tm/ts=1.25) can tolerate 31 dBm CW (continuous wave) RF power input at the upper edge of the filter passband (commonly the frequency with the highest power dissipation within a filter passband).

Figure 17:
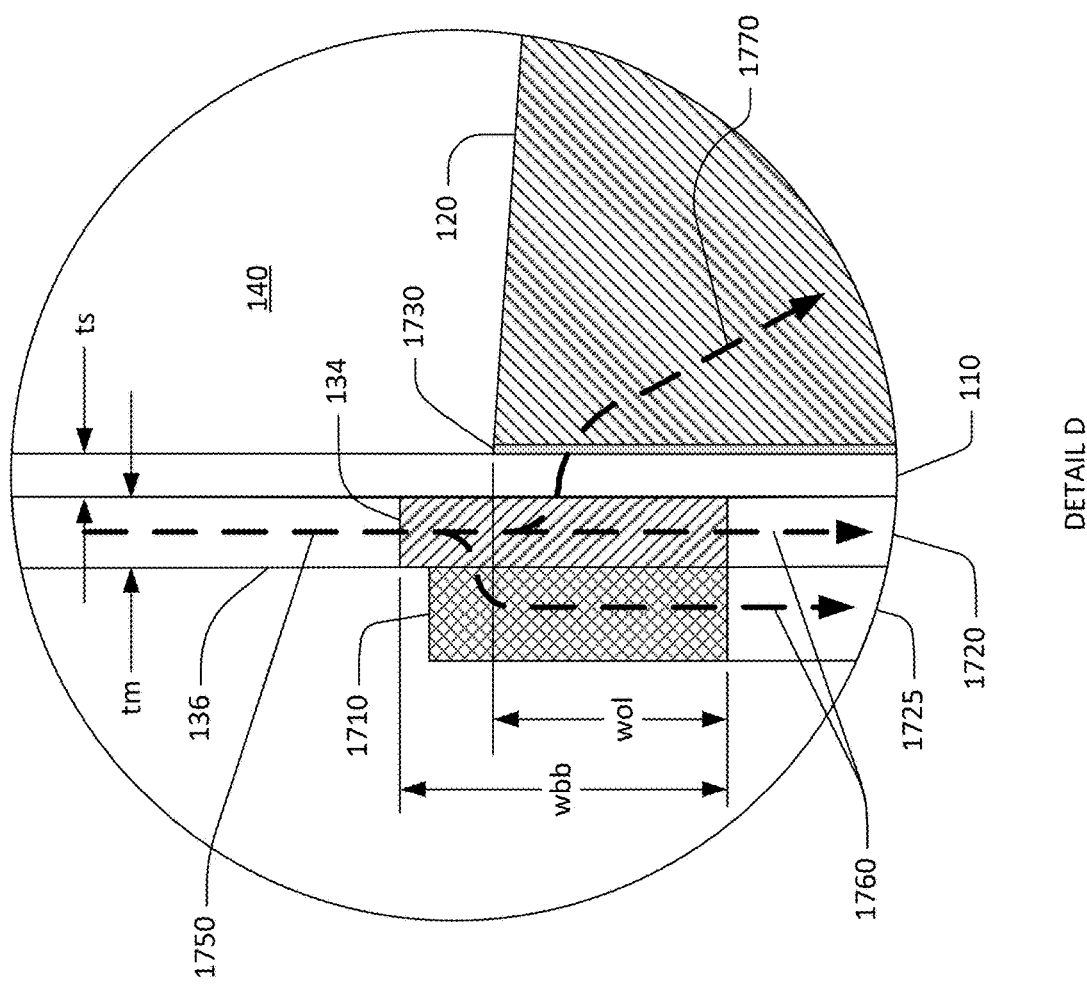
FIG. 17 is a detailed cross-section view of a portion of the XBAR 100 of FIG. 1.

In addition to having high thermal conductivity, large cross-section, IDT fingers and a reasonably small aperture, the various elements of an XBAR filter may be configured to maximize heat flow between the diaphragms and the environment external to the filter package. FIG. 17 is a cross-sectional view of a portion of an XBAR (detail D as defined in FIG. 1). The piezoelectric plate 110 is a single-crystal layer of piezoelectric material. A back side of the piezoelectric plate 110 is bonded to a substrate 120. A dielectric bonding layer 1730 may be present between the piezoelectric plate 110 and the substrate 120 to facilitate bonding the piezoelectric plate and substrate using a wafer bonding process. The bonding layer may typically be SiO2. A portion of the piezoelectric plate 110 forms a diaphragm spanning a cavity 140 in the substrate 120.

An IDT (130 in FIG. 1) is formed on the front side of the piezoelectric plate 110. The IDT includes two bus bars, of which only bus bar 134 is shown in FIG. 17, and a plurality of interleaved parallel fingers, such as finger 136, that extend from the bus bars onto a portion of the piezoelectric plate 110 forming the diaphragm spanning the cavity 140. A conductor 1720 extends from the bus bar 134 to connect the XBAR to other elements of a filter circuit. The conductor 1720 may be overlaid with a second conductor layer 1725. The second conductor layer may provide increased electrical and thermal conductivity. The second conductor layer 1725 may serve to reduce the electrical resistance of the connection between the XBAR 100 and other elements of the filter circuit. The second conductor layer may be the same or different material than the IDT 130. For example, the second conductor layer 1725 may also be used to form pads for making electrical connections between the XBAR chip to circuitry external to the XBAR. The second conductor layer 1725 may have a portion 1710 extending onto the bus bar 134.

As previously discussed, the metal conductors of the IDT (and the second conductor layer where present) provide a primary mechanism for removing heat from an XBAR device as indicated by the bold dashed arrows 1750, 1760, 1770. Heat generated in the XBAR device is conducted along the IDT fingers (arrow 1750) to the bus bars. A portion of the heat is conducted away from the bus bars via the conductor layers 1720, 1725 (arrows 1760). Another portion of the heat may pass from the bus bars through the piezoelectric plate 110 and the dielectric layer 1730 to be conducted away through the substrate 120 (arrow 1770).

To facilitate heat transfer from the conductors to the substrate, at least portions of the bus bars extend off of the diaphragm onto the part of the piezoelectric plate 110 that is bonded to the substrate 120. This allows heat generated by acoustic and resistive losses in the XBAR device to flow through the parallel fingers of the IDT to the bus bars and then through the piezoelectric plate to the substrate 120. For example, in FIG. 3, the dimension wbb is the width of the bus bar 134 and the dimension wol is the width of the portion of the bus bar 134 that overlaps the substrate 120. wol may be at least 50% of wbb. The bus bars may extend off of the diaphragm and overlap the substrate 120 along the entire length (i.e. the direction normal to the plane of FIG. 3) of the IDT.

To further facilitate heat transfer from the conductors to the substrate, a thickness of the bonding layer 1730 may be minimized. Presently, commercially available bonded wafer (i.e. wafers with a lithium niobate or lithium tantalate film bonded to a silicon wafer) have an intermediate SiO2 bonding layer with a thickness of 2 microns. Given the poor thermal conductivity of SiO2, it is preferred that the thickness of the bonding layer be reduced to 100 nm or less.

The primary path for heat flow from a filter device to the outside world is through the conductive bumps that provide electrical connection to the filter. Heat flows from the conductors and substrate of the filter through the conductive bumps to a circuit board or other structure that acts as a heat sink for the filter. The location and number of conductive bumps will have a significant effect on the temperature rise within a filter. For example, resonators having the highest power dissipation may be located in close proximity to conductive bumps. Resonators having high power dissipation may be separated from each other to the extent possible. Additional conductive bumps, not required for electrical connections to the filter, may be provided to improve heat flow from the filter to the heat sink.

Figure 18:
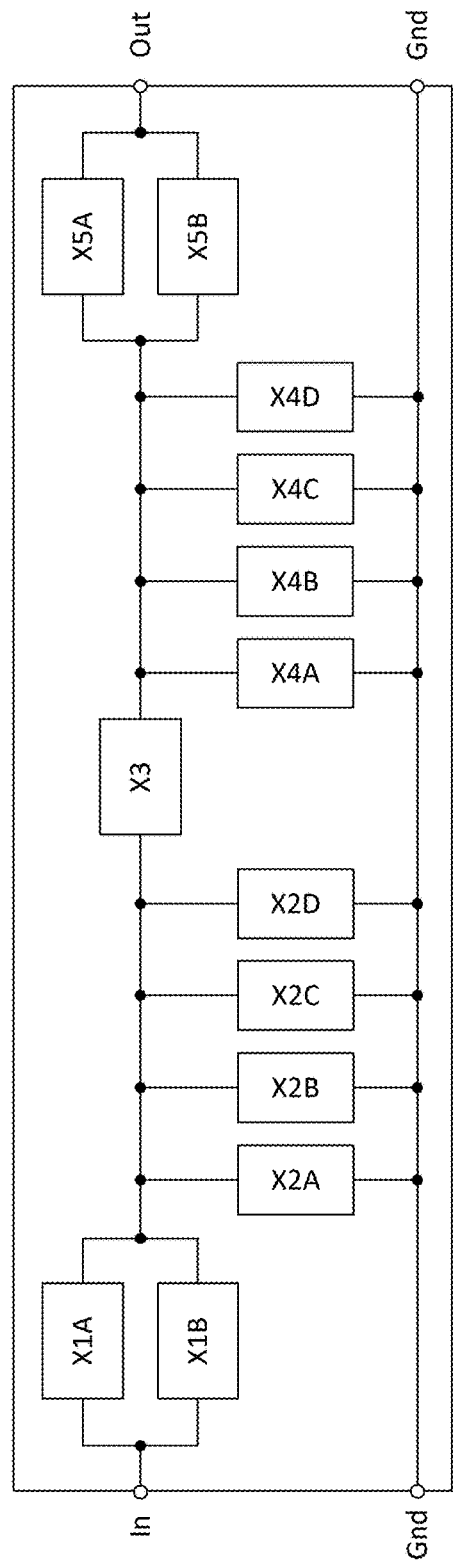
FIG. 18 is a schematic circuit diagram of an exemplary high-power band-pass filter using XBARs.

FIG. 18 is a schematic diagram of an exemplary high-power XBAR band-pass filter for band n79. The circuit of the band-pass filter 1800 is a five-resonator ladder filter, similar to that of FIG. 5. Series resonators X1 and X5 are each partitioned into two portions (X1A/B and X5A/B, respectively) connected in parallel. Shunt resonators X2 and X4 are each divided into four portions (X2A/B/C/D and X4A/B/C/D, respectively) that are connected in parallel. Dividing the resonators into two or four portions has the benefit of reducing the length of each diaphragm. Reducing the diaphragm length is effective to increase the mechanical strength of the diaphragm.

Figure 19:
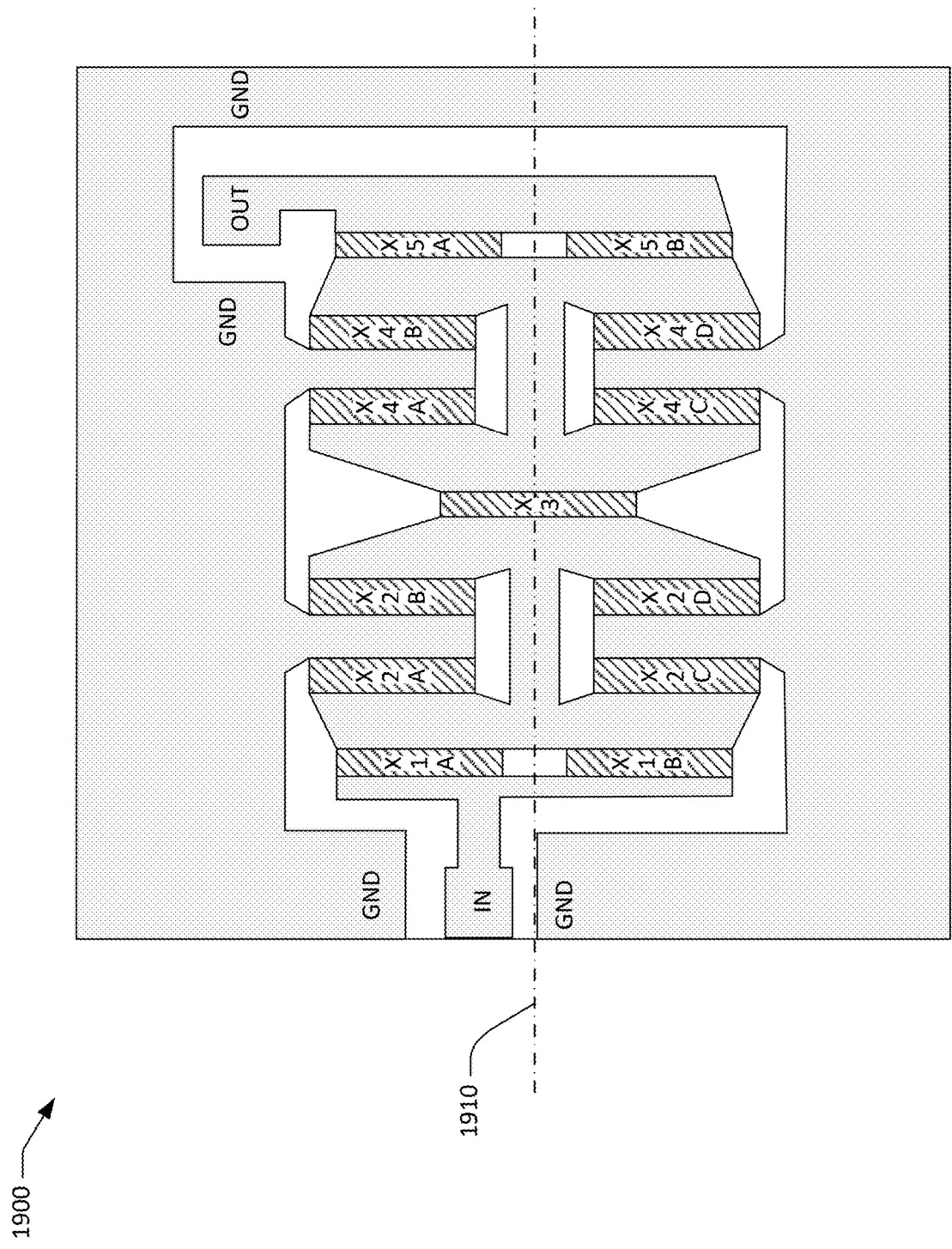
FIG. 19 is a layout of the filter of FIG. 18.

FIG. 19 shows an exemplary layout 1900 for the band-pass filter 1800. In this example, the resonators are arranged symmetrically about a central axis 1910. The signal path flows generally along the central axis 1910. The symmetrical arrangement of the resonators reduces undesired coupling between elements of the filter and improves stop-band rejection. The length of each of the resonators is arranged in the direction normal to the central axis. The two portions of series resonators X1A-B and X5A-B are arranged in-line along the direction normal to the central axis. These resonators would be divided into more than two portions arranged in the same manner. The series resonator X3 could be divided not two or more portions. The shunt resonators are divided into four portion X2A-D and X4A-D, with the portions disposed in pairs on either side of the central axis 1910. Positioning the shunt resonator segments in this manner minimizes the distance between the center of each resonator portion and the wide ground conductors at the top and bottom (as seen in FIG. 19) of the device. Shortening this distance facilitates removing heat from the shunt resonator segments. Shunt resonators can be divided into an even number of portions, which may be two, four (as shown), or more than four. In any case, the half of the portions are positioned on either side of the central axis 1910. In other filters, the input port IN and the output port OUT may also be disposed along the central axis 1910.

Figure 20:
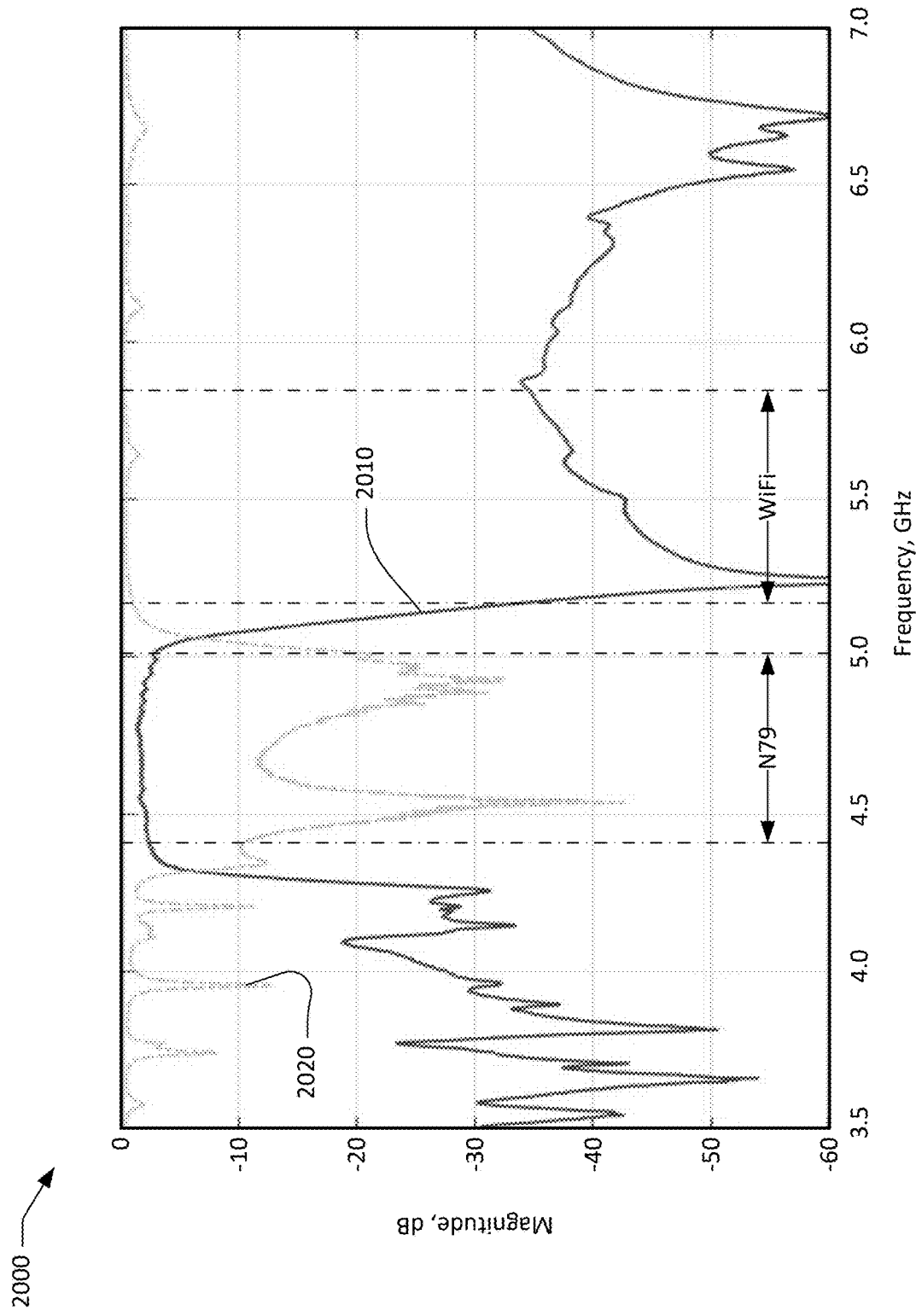
FIG. 20 is a graph of measured S-parameters S11 and S21 versus frequency for the filter of FIG. 18 and FIG. 19.

FIG. 20 is a chart 2000 showing measured performance of the band-pass filter 1800. The XBARs are formed on a Z-cut lithium niobate plate. The thickness is of the lithium niobate plate is 400 nm. The substrate is silicon, the IDT conductors are aluminum, the front-side dielectric, where present, is SiO2. The thickness tm of the IDT fingers is 500 nm, such that tm/ts=1.25. The other physical parameters of the resonators are provided in the following table (all dimensions are in microns; p=IDT pitch, w=IDT finger width, AP=aperture, L=length, and tfd=front-side dielectric thickness):

| Parameter | Series Resonators | | | Shunt Resonators | |
| --- | --- | --- | --- | --- | --- |
| | X1* | X3 | X5* | X2** | X4** |
| p | 3.75 | 3.75 | 3.75 | 4.12 | 4.12 |
| w | 1.01 | 0.86 | 1.10 | 0.84 | 0.93 |
| AP | 44 | 37 | 41 | 58 | 57 |
| L | 350 | 420 | 350 | 350 | 350 |
| tfd | 0 | 0 | 0 | 0.100 | 0.100 |

*Each of 2 sections
**Each of 4 sections

The series resonators correspond to the filled circle 1240 in FIG. 12, and the shunt resonators correspond to the filled circle 1340 in FIG. 13.

In FIG. 20, the solid line 2010 is a plot of S(1,2), which is the input-output transfer function of the filter, as a function of frequency. The dashed line 2020 is a plot of S(1,1), which is the reflection at the input port, as a function of frequency. The dash-dot vertical lines delimit band N79 from 4.4 to 5.0 GHz and the 5 GHz Wi-Fi band from 5.17 GHz to 5.835 GHz. Both plots 2010, 2020 are based on wafer probe measurements having 50-ohm impedance.

Figure 21:
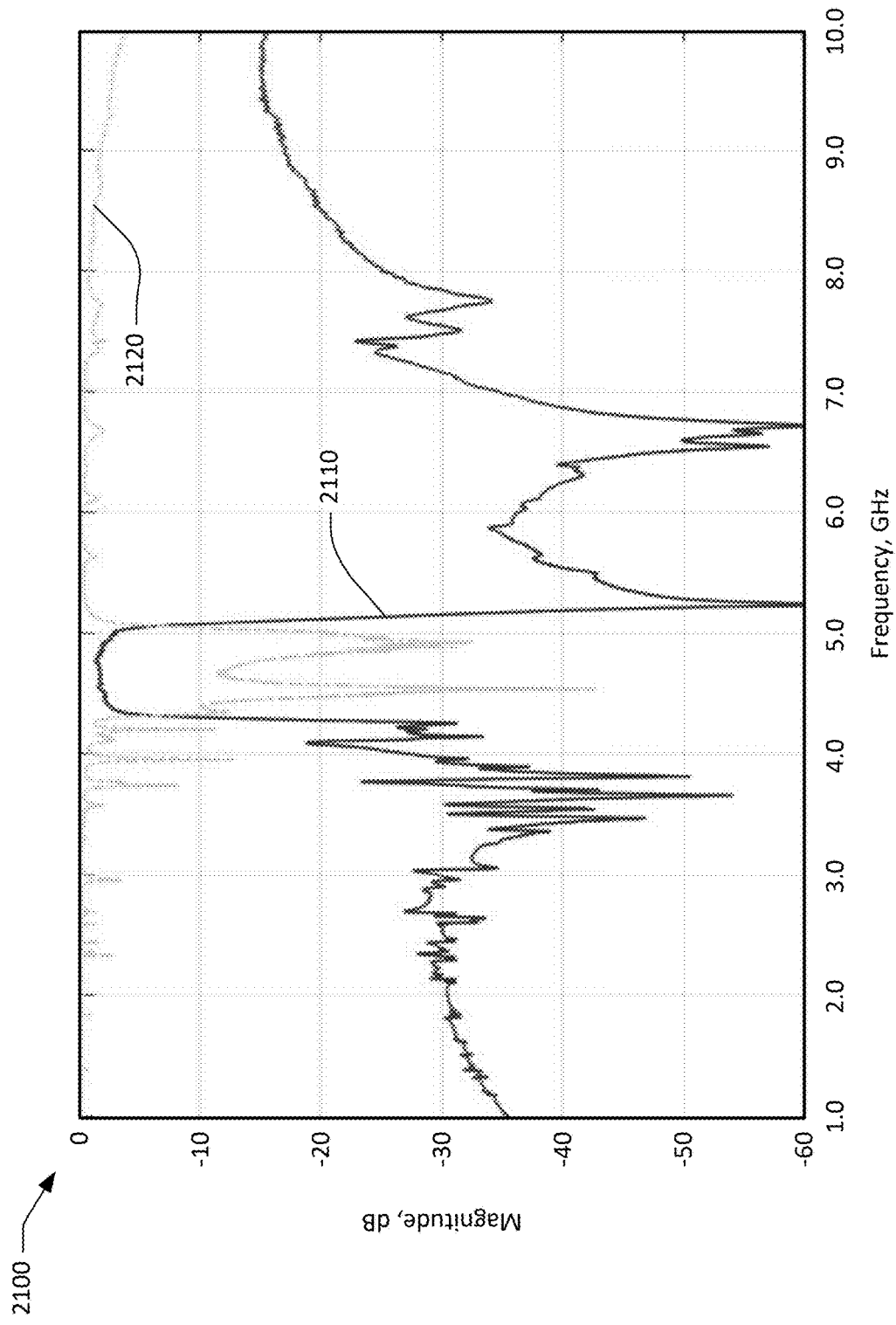
FIG. 21 is a graph of measured S-parameters S11 and S21 versus frequency, over a wider frequency range, for the filter of FIG. 18 and FIG. 19.

FIG. 21 is a chart 2100 showing measured performance of the band N79 band-pass filter 1800 over a wider frequency range. In FIG. 21, the solid line 2110 is a plot of S(1,2), which is the input-output transfer function of the filter, as a function of frequency. The dashed line 2120 is a plot of S(1,1), which is the reflection at the input port, as a function for frequency. Both plots 2110, 2120 are based on wafer probe measurements corrected for 50-ohm impedance.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
    a substrate having a surface;
    a Z-cut lithium niobate piezoelectric plate having front and back surfaces, the back surface attached to the surface of the substrate except for a portion of the piezoelectric plate forming a diaphragm that spans a cavity in the substrate; and
    an interdigital transducer (IDT) formed on the front surface of piezoelectric plate such that interleaved fingers of the IDT are disposed on the diaphragm, the piezoelectric plate and the IDT configured such that a radio frequency signal applied to the IDT excites a shear primary acoustic mode in the diaphragm, wherein
    a thickness of the interleaved fingers of the IDT is greater than or equal to 0.85 times a thickness of the piezoelectric plate and less than or equal to 2.5 times the thickness of the piezoelectric plate.

2. The acoustic resonator device of claim 1, wherein the interleaved fingers of the IDT are substantially aluminum.

3. The acoustic resonator device of claim 2, further comprising:
    a front-side dielectric layer deposited between the fingers of the IDT, a thickness of the front-side dielectric layer being greater than zero and less than or equal to 0.25 times the thickness of the piezoelectric plate,
    wherein the thickness of the interleaved fingers of the IDT is greater than or equal to 0.875 times the thickness of the piezoelectric plate and less than or equal to 2.25 times the thickness of the piezoelectric plate.

4. The acoustic resonator device of claim 1, wherein the interleaved fingers of the IDT are substantially copper, and
    the thickness of the interleaved fingers of the IDT is within
        a range of greater than or equal to 0.85 times the thickness of the piezoelectric plate and less than 1.42 times the thickness of the piezoelectric plate, or
        a range of greater than or equal to 1.95 times the thickness of the piezoelectric plate and less than 2.325 times the thickness of the piezoelectric plate.

5. The acoustic resonator device of claim 4, further comprising:
    a front-side dielectric layer deposited between the fingers of the IDT, a thickness of the front-side dielectric layer being greater than zero and less than or equal to 100 nm,
    wherein the thickness of the interleaved fingers of the IDT is within the range of greater than or equal to 0.85 times the thickness of the piezoelectric plate and less than or equal to 1.42 times the thickness of the piezoelectric plate.

6. The acoustic resonator device of claim 1, wherein the thickness of the piezoelectric plate is greater than or equal to 300 nm and less than or equal to 500 nm.

7. The acoustic resonator device of claim 1, wherein a pitch of the interleaved fingers of the IDT is greater than or equal to 6 times the thickness of the piezoelectric plate and less than or equal to 12.5 times the thickness of the piezoelectric plate.

8. The acoustic resonator device of claim 1, wherein an aperture of the IDT is greater than or equal to 20 microns and less than or equal to 60 microns.

9. The acoustic resonator device of claim 1, wherein a direction of acoustic energy flow of the primary acoustic mode is substantially normal to the front and back surfaces of the diaphragm.

10. The acoustic resonator device of claim 1, wherein the diaphragm is contiguous with the piezoelectric plate around at least 50% of a perimeter of the cavity.

11. A filter device, comprising:
a substrate;
a Z-cut lithium niobate piezoelectric plate having front and back surfaces, the back surface attached to the surface of the substrate, portions of piezoelectric plate forming one or more diaphragms spanning respective cavities in the substrate; and
a conductor pattern formed on the front surface, the conductor pattern including a plurality of interdigital transducers (IDTs) of a respective plurality of acoustic resonators, interleaved fingers of each of the plurality of IDTs disposed on a diaphragm of the one or more diaphragms, the piezoelectric plate and all of the IDTs configured such that respective radio frequency signals applied to each IDT excite respective shear primary acoustic modes in the respective diaphragms, wherein
the interleaved fingers of all of the plurality of IDTs have a common finger thickness, which is greater than or equal to 0.85 times a thickness of the piezoelectric plate and less than or equal to 2.5 times the thickness of the piezoelectric plate.

12. The filter device of claim 11, wherein the interleaved fingers of all of the plurality of IDTs are substantially aluminum.

13. The filter device of claim 12, further comprising:
a front-side dielectric layer deposited between the fingers of at least one of the plurality of IDTs, a thickness of the front-side dielectric layer being greater than zero and less than or equal to 0.25 times the thickness of the piezoelectric plate,
wherein the common finger thickness is greater than or equal to 0.875 times the thickness of the piezoelectric plate and less than or equal to 2.25 times the thickness of the piezoelectric plate.

14. The filter device of claim 11, wherein the interleaved fingers of all of the plurality of IDTs are substantially copper, and
the common finger thickness is greater than or equal to 0.85 times the thickness of the piezoelectric plate and less than 1.42 times the thickness of the piezoelectric plate.

15. The filter device of claim 14, further comprising:
a front-side dielectric layer deposited between the fingers of at least one of the plurality of IDTs, a thickness of the front-side dielectric layer being greater than zero and less than or equal to 0.25 times the thickness of the piezoelectric plate.

16. The filter device of claim 11, wherein the thickness of the piezoelectric plate is greater than or equal to 300 nm and less than or equal to 500 nm.

17. The filter device of claim 11, wherein respective pitches of the interleaved fingers of all of the plurality of IDTs are greater than or equal to 6 times the thickness of the piezoelectric plate and less than or equal to 12.5 times the thickness of the piezoelectric plate.

18. The filter device of claim 11, wherein respective apertures of all of the plurality of IDTs are greater than or equal to 20 microns and less than or equal to 60 microns.

19. The filter device of claim 11, wherein a direction of acoustic energy flow of the respective primary acoustic modes excited by all of the IDTs is substantially normal to the front and back surfaces of the diaphragm.

20. The filter device of claim 11, wherein each diaphragm of the one or more diaphragms is contiguous with the piezoelectric plate around at least 50% of a perimeter of the respective cavity.

21. A filter device, comprising:
a substrate;
a Z-cut lithium niobate piezoelectric plate having front and back surfaces, the back surface attached to the surface of the substrate, portions of piezoelectric plate forming one or more diaphragms spanning respective cavities in the substrate;
a conductor pattern formed on the front surface, the conductor pattern including a plurality of interdigital transducers (IDTs) of a respective plurality of acoustic resonators, interleaved fingers of each of the plurality of IDTs disposed on a diaphragm of the one or more diaphragms, the plurality of resonators including one or more shunt resonators and one or more series resonators;
a first dielectric layer having a first thickness deposited between the fingers of the IDTs of the one or more shunt resonators; and
a second dielectric layer having a second thickness deposited between the fingers of the IDTs of the one or more series resonators, wherein the second thickness is less than the first thickness and greater than or equal to zero, and
the interleaved fingers of all of the plurality of IDTs have a common finger thickness, which is greater than or equal to 0.875 times a thickness of the piezoelectric plate and less than 2.25 times the thickness of the piezoelectric plate.

22. The filter device of claim 21, wherein the interleaved fingers of all of the plurality of IDTs are substantially aluminum.

23. The filter device of claim 21, wherein the interleaved fingers of all of the plurality of IDTs are substantially copper, and
the common finger thickness is greater than or equal to 0.85 times the thickness of the piezoelectric plate and less than 1.42 times the thickness of the piezoelectric plate.

24. The filter device of claim 21, wherein the thickness of the piezoelectric plate is greater than or equal to 300 nm and less than or equal to 500 nm.

25. The filter device of claim 21, wherein
respective pitches of the interleaved fingers of all of the plurality of IDTs are greater than or equal to 6 times the thickness of the piezoelectric plate and less than or equal to 12.5 times the thickness of the piezoelectric plate.

26. The filter device of claim 21, wherein
respective apertures of all of the plurality of IDTs are greater than or equal to 20 microns and less than or equal to 60 microns.

27. The filter device of claim 21, wherein
a direction of acoustic energy flow of the respective primary acoustic modes excited by all of the plurality of IDTs is substantially orthogonal to the front and back surfaces of the diaphragm.

28. The filter device of claim 21, wherein
each diaphragm of the one or more diaphragms is contiguous with the piezoelectric plate around at least 50% of a perimeter of the respective cavity.

29. The filter device of claim 21, wherein
the first thickness is less than or equal to 0.25 times the thickness of the piezoelectric plate.

\* \* \* \* \*